US008720370B2

(12) United States Patent
Rebstock

(10) Patent No.: US 8,720,370 B2
(45) Date of Patent: May 13, 2014

(54) METHODS AND APPARATUSES FOR ROLL-ON COATING

(75) Inventor: Lutz Rebstock, Gaienhofen (DE)

(73) Assignee: Dynamic Micro System Semiconductor Equipment GmbH, Radolfzell (DE)

( * ) Notice: Subject to any disclaimer, the term of this patent is extended or adjusted under 35 U.S.C. 154(b) by 57 days.

(21) Appl. No.: 13/210,373

(22) Filed: Aug. 16, 2011

(65) Prior Publication Data
US 2012/0258240 A1 Oct. 11, 2012

Related U.S. Application Data

(63) Continuation-in-part of application No. 13/081,506, filed on Apr. 7, 2011.

(51) Int. Cl.
B05C 11/00 (2006.01)
B05C 1/08 (2006.01)
B05C 3/00 (2006.01)

(52) U.S. Cl.
USPC ........... 118/667; 118/202; 118/244; 118/258; 118/58; 118/69

(58) Field of Classification Search
USPC ......... 118/122, 126, 236, 249, 259, 260, 266, 118/268, 202, 258, 224, 244, 666, 667, 58, 118/69; 136/252, 255, 256
See application file for complete search history.

(56) References Cited

U.S. PATENT DOCUMENTS

| 3,805,738 | A | | 4/1974 | Kitazawa |
| 4,323,419 | A | * | 4/1982 | Wakefield ........................ 438/62 |
| 5,316,579 | A | * | 5/1994 | McMillan et al. .............. 118/50 |
| 5,878,811 | A | * | 3/1999 | Falzone ........................ 165/255 |
| 7,104,216 | B2 | * | 9/2006 | Suzuki et al. ................... 118/46 |
| 2003/0175441 | A1 | | 9/2003 | Bernards |
| 2008/0210294 | A1 | * | 9/2008 | Moslehi ........................ 136/251 |
| 2009/0317555 | A1 | * | 12/2009 | Hori ........................ 427/428.06 |
| 2010/0154998 | A1 | * | 6/2010 | Ong ................................ 159/49 |
| 2011/0256377 | A1 | * | 10/2011 | Chiruvolu et al. ............ 428/220 |

FOREIGN PATENT DOCUMENTS

WO 03/054975 7/2003

OTHER PUBLICATIONS

S. Queisser, Novel precursor deposition method for inline diffusion, 23 EU-PVSEC, Valencia 2008.
PCT preliminary report on patentability—PCT/IB2012/000710—dated Oct. 8, 2013.

* cited by examiner

Primary Examiner — Yewebdar Tadesse
(74) Attorney, Agent, or Firm — Tue Nguyen

(57) ABSTRACT

Coating rollers accepting liquid media provide liquid chemicals to substrates for depositing a thin coating layer on the flat substrates, such as semiconductors or panels. The liquid media is cooled to a life-preserving temperature while shielded from the thermal energy heating the substrates to prevent degrading the liquid media. Physical barrier or temperature barrier can be established in vicinities of the rollers to further limit exposing the liquid media to high temperature.

20 Claims, 18 Drawing Sheets

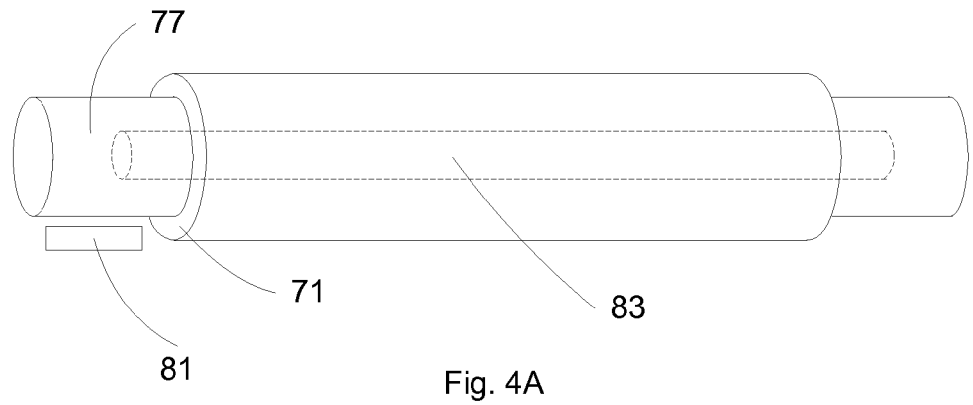
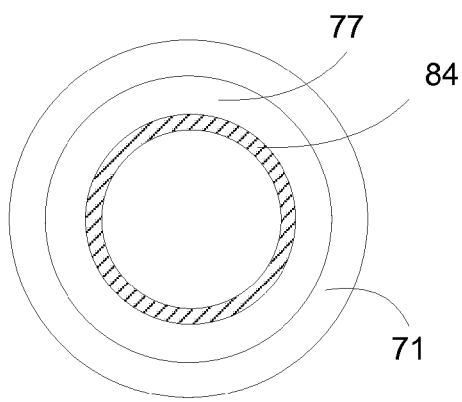
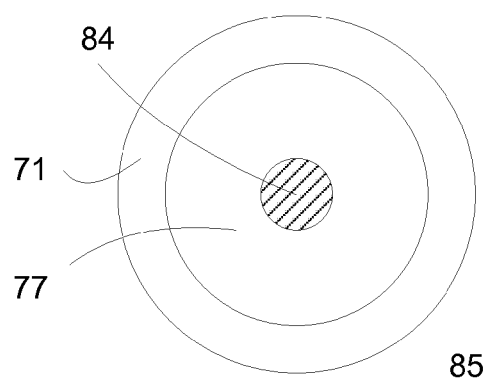
Fig. 4A
Fig. 4B
Fig. 4C

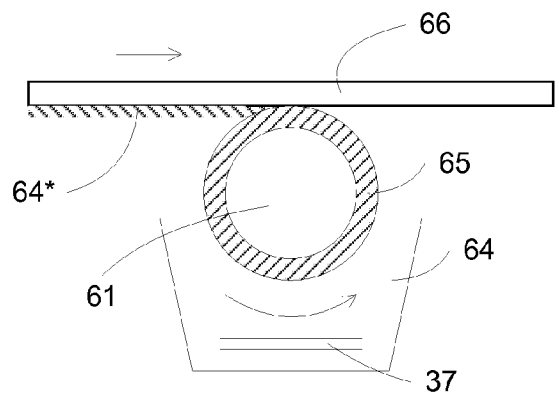
Fig. 5A
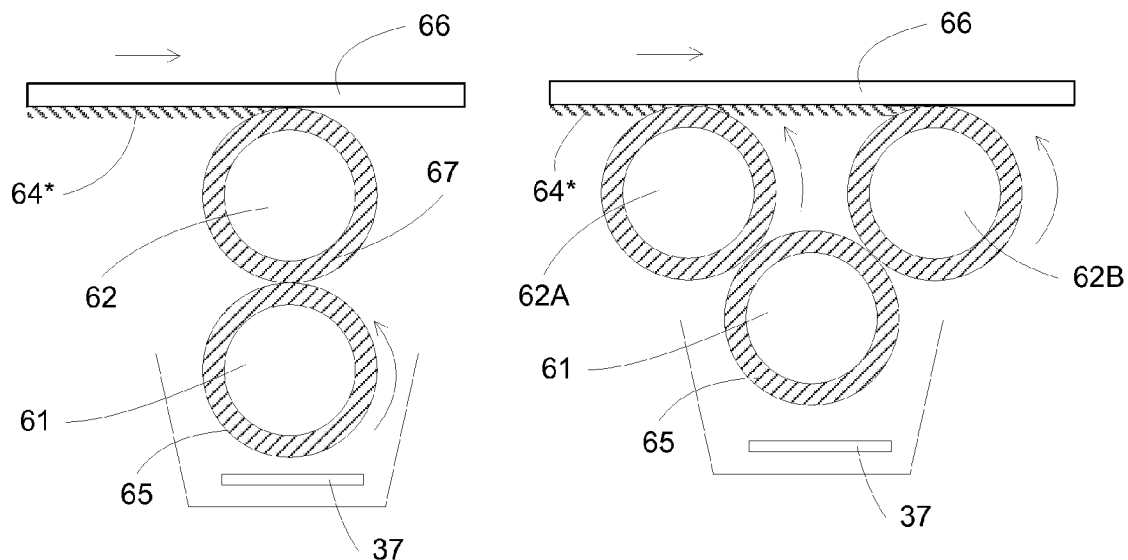
Fig. 5B
Fig. 5C

METHODS AND APPARATUSES FOR ROLL-ON COATING

This application is a continuation-in-part of co-pending application "Methods and apparatuses for roll-on coating", application Ser. No. 13/081,506 filed on Apr. 7, 2011, and assigned to the same entity, hereby incorporated by reference.

BACKGROUND

In photovoltaic devices, electrical energy is converted from light via the photoelectric effect and resulting charges are collected via pn junctions in semiconductor substrates for current generation. PN junctions can be formed by means of diffusing dopants into the bulk semiconductor material. The diffusion process can occur from a dopant vapor ambient, for example, phosphine or $POCl_3$, or from solid source releasing dopant vapor. Another process can employ a dopant layer coated on the substrate, which, upon heating or firing, causes the dopant to diffuse from the dopant layer into the substrate. Another important process in solar cell fabrication is thin film deposition, such as the coating of passivation or absorber layer.

In-line fabrication processes, such as in-line doping diffusion or in-line thin film deposition, are preferred processes for minimizing cost and toxicity. For example, in a typical in-line diffusion process, the substrate is coated with a dopant containing layer and subsequently, the dopants from the dopant layer are diffused into the substrate in a furnace. The coating of the dopant source can be accomplished by spraying, dipping, spin-on, or condensation of a dopant-containing chemical, in liquid or gaseous form, with or without solvent, and with or without carrier gas. Such systems can be difficult to control with respect to uniformity and doping levels, particularly on textured surfaces. Also these processes often require significant excess chemicals, driving up the cost of production.

SUMMARY

The present invention relates to methods and apparatuses for coating substrates, such as coating thin films or dopant layers on single crystalline or multicrystalline silicon substrates. In some embodiments, the present invention discloses a roll-on coating process for coating a layer on the substrate surfaces, for example, a passivation or absorber layer, or a dopant layer in which the dopants are then diffuse into the substrate after a high temperature anneal, forming a pn junction for solar cells.

In some embodiments, the present invention discloses a system for roll-on coating a substrate, comprising at least a coating roller accepting a fluid and then migrating the fluid to the roller surface. Upon contacting a substrate surface, the fluid on the coating roller's surface is transferred to the substrate surface, forming a coating layer. The fluid can comprise active chemicals in a solution mixture, which is subsequently dried to form a solid thin film layer on the substrate. The fluid can comprise a dopant chemical, which is continuously supplied to the coating roller for coating a plurality of substrate surfaces by rolling contact. The dopant chemical can contain boron, arsenic or phosphorus chemical in a solution or mixture form.

In some embodiments, the present invention discloses systems and methods for surface coating using sensitive chemicals, such as chemicals that can be easily degraded by the high processing temperature. Thus in some embodiment, the present invention provides a hot zone at the substrate, for example, for the chemicals to react, and a cool zone a short distance away, for example, to preserve the life time of the chemicals or to prevent the chemical from being degraded due to high temperature exposure.

In some embodiments, the hot zone is established by one or more heaters, such as IR heaters or resistance heaters, located in the vicinity of the substrate to heat the substrate without heating the liquid chemicals. The cool zone is established by one or more temperature controlling devices, such as cooling devices, Peltiers devices, or refrigeration devices, located in a liquid reservoir or in a vicinity of the coating rollers to reduce the thermal exposure.

In some embodiments, the present invention discloses systems comprising a heating mechanism to heat the substrate, one or coating rollers contacting the substrate and accepting a liquid which is transferred to the substrate surface by rollingly contact, and a temperature control device coupled to the liquid to cool the liquid to a temperature below room temperature, preferably less than 10 C, such as 7 C. The coating roller can comprise a cylindrical structure spanning across a large substrate or a number of smaller substrates. The substrates can be positioned above the roller, under the roller, or sandwiched between two rollers, and moved relative to a rotation of the roller. The coating roller can be configured to accept a fluid located in a fluid reservoir, from another roller, or from a mechanism bringing the fluid to the coating roller surface. The surface of the coating roller can comprise a soft porous layer covering the outer surface of the coating roller, which is wetted with the fluid at the roller's surface, for example, the fluid coming from the contact with the fluid reservoir. Upon contacting a substrate, the wetted porous layer can transfer the fluid to the substrate surface, effectively coating the substrate surface with a layer of the fluid. In some embodiments, the fluid supplied roller is configured for delivering a uniform coating across the substrate surface, for example, by a uniform distribution of the pores in the porous layer along the length of the coating roller. In another embodiment, the coating roller is configured to tailor the delivery of the fluid, effectively providing different coating thickness at different portions of the substrates, for example, by a non-uniform distribution of pores or a non-uniform pore density of the porous layer. This thickness non-uniformity can be used to compensate for subsequent process non-uniformity, for example, the non-uniformity of the anneal temperature in a diffusion furnace during the dopant drive-in process.

In some embodiments, heating devices such as heaters can be provided for heating the substrate. Local heating is preferred, for example, to prevent heat transferred to the liquid reservoir. In addition, heaters/coolers can be provided to heat/cool the coating roller. For example, an additional heater or cooler can provide heat or cool to the coating roller, ensuring that the fluid is at appropriate temperature when reaching the substrate. This temperature is preferably less than the substrate temperature, to prevent degradation to the coating roller (such as the porous layer), or to prevent degradation to sensitive chemicals, which, in some cases, cannot be exposed to high temperature for a long time. An intermediate temperature is preferred in order not to affect the coating process.

In some embodiments, temperature control devices such as coolers can be provided for cooling the fluid, either at the fluid reservoir, at the fluid delivery lines, and/or at the coating roller. The coolers are preferably disposed at a vicinity of the coating rollers, to limit the exposure of the fluid to the heated zone. For example, the coolers can be less than 10 cm, and preferably less than 5 cm away from the coating rollers, effectively preventing the fluid in the fluid reservoir from getting heated.

In some embodiments, a stirrer mechanism is included to equalize the temperature in the fluid reservoir. The stirrer mechanism can comprise one or more paddles coupled to a rotational mechanism to stir the fluid. The stirrer mechanism can comprise a recirculation mechanism, recirculating the fluid passing the cooling devices. Filters can be added, for example, to filtering the effect of heat exposure.

In some embodiments, the present invention discloses an in-line coating system, comprising a plurality of rotating coating rollers for coating a substrate. The coating roller can be positioned above the substrate for coating the top surface of the substrate. The coating roller can be positioned under the substrate for coating the bottom surface of the substrate. Two rollers can sandwich the substrate to coat the top and bottom surfaces of the substrate simultaneously. The rotating rollers can double as a transporting mechanism, continuously moving a plurality of substrates from an input to an output stage of the in-line coating system. The in-line coating system can further comprise means of controllably reducing the amount of dopant or carrier fluid on the substrates, such as additional liquid absorbing intrinsically dry rollers.

In some embodiments, the in-line coating system further comprises additional coating mechanisms, such as spraying nozzles for delivering additional fluid onto the substrate surfaces. Further the in-line coating system can comprise additional roller wetting mechanisms, such as providing an outer belt to deliver fluid to the outer surface of the roller, or providing a fluid-filled pan for mounting the roller.

In some embodiments, the present invention discloses an integrated in-line processing system, comprising an in-line coating system for coating a dopant layer on the substrates feeding an in-line furnace anneal system for driving the dopant into the substrates from the surface coating layer. The coating system and the furnace anneal system can be disposed next to each other, or can be separated, for example, by a transport line. The system may also consist of a pre-conditioning step prior to processing such as ozone treatment or chemical oxidation.

BRIEF DESCRIPTION OF THE DRAWINGS

FIGS. 4A-4C illustrate exemplary configurations for temperature control devices according to an embodiment of the present invention.

FIGS. 5A-5C illustrate exemplary coating processes according to an embodiment of the present invention.

DETAILED DESCRIPTION OF THE PREFERRED EMBODIMENTS

The present invention relates to methods and systems for uniform deposition of materials on a flat substrate, such as photovoltaic substrates, for creation of thin layers by a roll-on technology. The thin layers can be any layer deposited by a liquid material. For example, the thin layers can comprise Phosphorus or Boron, deposited on a semiconductor layer for emitter formation after subsequent treatments. The thin layers can also be absorber layers, for example CdS or ZnS, in thin film photovoltaic processing.

The present invention further pertains to the manufacture of photovoltaic cells, such as in crystalline solar cell manufacturing, including improved dopant coating processes and systems for producing photovoltaic emitter junctions by dopant diffusion. The substrate is preferably single crystal or multicrystalline (or polycrystalline) substrate, but other semiconductor substrate can also be utilized. The present invention can provide high performance junctions for cost reduction and efficiency improvement in photovoltaic cells and related devices. In some embodiments, the substrate is first exposed to a fluid-containing surface comprising dopant material, such as phosphorus, arsenic, or boron compounds, such as phosphoric acid ($H_3PO_4$). The exposure will form a dopant coating on the substrate surface. Afterward, the dopant coating maybe subjected to a high temperature ambient to diffuse the dopant into the substrate or annealed in a furnace at high temperature, for example, between 600 and 1000 C.

In another embodiment, the present invention discloses a deposition process by liquid roll-on technology, such as absorber layers in thin film photovoltaic, including controlled heating of the substrates for deposition of the layer constituents from the coating fluid, for example by crystallization.

Figure 1A:
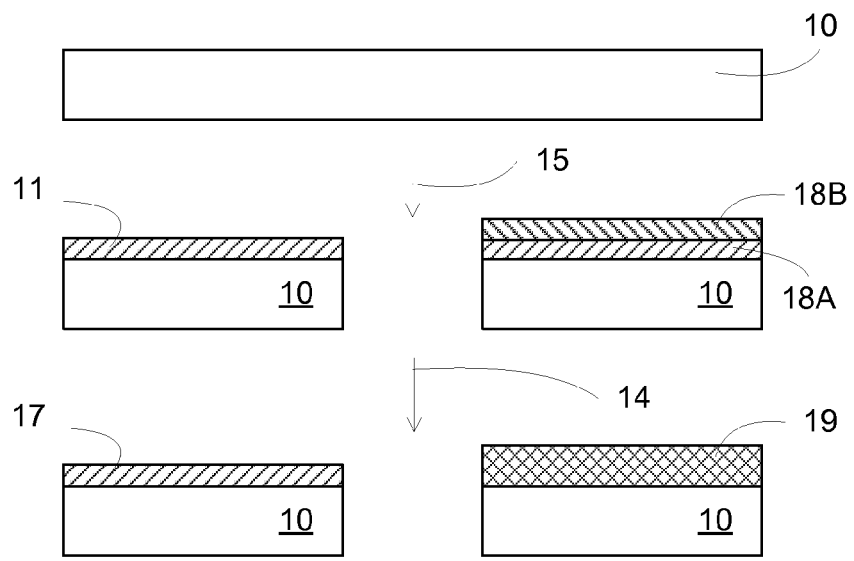
FIGS. 1A-1B illustrate exemplary process flows according to embodiments of the present invention.

FIG. 1A illustrates an exemplary process flow according to an embodiment of the present invention. A substrate 10 is provided, which can comprise various layers, such as a semiconductor layer. The substrate 10 is then exposed to a liquid coating process 15, which forms a dropletless liquid coating layer 11 on the substrate 10. The layer 11 can be formed by contact with a fluid surface to generate a liquid layer coated on the substrate, and then can be exposed 14, e.g., drying or annealing, to an elevated temperature ambient to form coating 17. For example, solutions containing $CdCl_2$ or $CdI_2$ can be used to form a coating, which is then exposed to an ambient containing S to form CdS. Alternatively, multiple coating processes can be performed, forming coatings 18A and 18B. The multilayer 18A/18B can be annealed 14 in a high temperature ambient to form a composited coating 19.

Figure 1B:
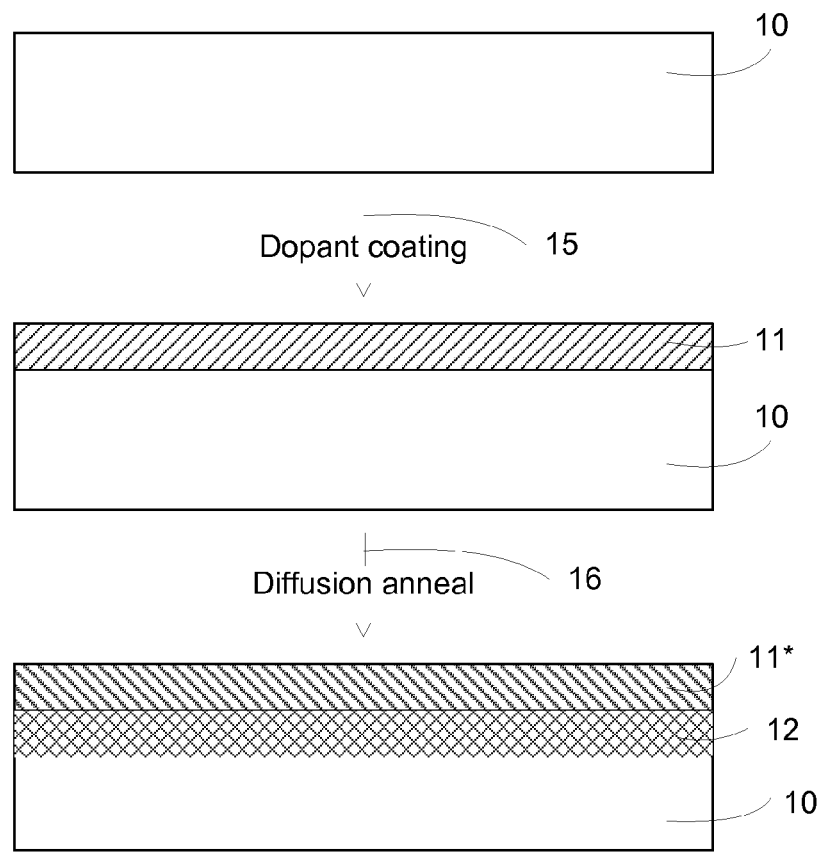

FIG. 1B illustrates another exemplary process flow according to an embodiment of the present invention. A substrate 10 is provided, which is preferably a semiconductor substrate, such as a single crystal or multicrystalline silicon substrate. Alternatively, the substrate can comprise a layer of semiconductor material on a support substrate. The substrate material can also be non-semiconductor, such as W, ITO or metallic mirror material. In addition, other processes can be performed on the substrate 10 before exposing the substrate to the dopant ambient. For example, an oxide passivation layer can be formed on the silicon substrate to protect the substrate, or a hydrophilic layer can be coated on the surface of the substrate 10 to improve the wettability of the substrate surface. The passivation layer can further prevent high concentration of dopant at the surface of the semiconductor substrate. For example, at the interface of the dopant layer, a high concentration of dopant can be formed after a high temperature diffusion process, which might affect the quality and functionality of the pn junction. Thus the passivation layer can protect the semiconductor substrate from this high surface concentration. The buffer layer can also act as an interface layer between the dopant and the substrate, providing adhesion and surface preparation for the coating of the dopant layer.

The substrate 10 is then exposed to a dopant coating process 15, which forms a dopant layer 11 on the substrate 10. The dopant layer 11 is preferably a solid dopant source, comprising the appropriate dopant for forming a pn junction with the semiconductor substrate 10. The dopant layer 11 can be formed by contact with a fluid surface to generate a liquid layer coated on the substrate, and then dried in an elevated temperature ambient. The coating process comprises a dopant precursor, such as phosphorus-containing chemicals (phosphorus acid, phosphine), boron-containing chemicals, or arsenic-containing chemicals. The dopant precursors can be delivered in liquid or semi-liquid form, and with or without solvent or carrier gas. Other dopant sources in liquid form can be used, including solutions and mixtures.

In some embodiments, the dopant material is phosphorus, for example, from phosphorus acid solution. For example, phosphorus acid solution is applied to the core of the roller, which then rolls on the substrate to form a phosphoric acid coating. An exhaust or a hood, and a capture pan can be included to capture any phosphorus acid not adhered to the substrate.

The substrate may then be dried 11* and annealed 16 in a diffusion furnace, or the substrate may be directly annealed without a dry step. The anneal temperature may be about 800 to 900 C to drive phosphorus into the substrate to form a doping layer 12.

In some embodiments, the present invention discloses a system for coating a substrate, comprising a rotated roller with outer surface wetted from a fluid supplied through an inner core. In some embodiments, the present system comprises a plurality of rotated soft porous rollers for liquid media deposition, wherein the rollers is wetted with the liquid media supplied from one end of the rollers. The rotated soft porous rollers can be used to simultaneously transport the substrates, for example, in an in-line conveyor mechanism.

An advantage of the invention includes the ability to combine the transport of the substrates in an inline process system with the deposition process. The substrates are fed through the system in single or multiple parallel lanes by a sequence of rotated rollers, which can be positioned on top and/or bottom of the substrates. Rotating the rollers will move the substrates linearly from the input of the in-line process system to the output end. Liquid media is supplied to the rollers at one end, and traveled through inner channels of the rollers to wet the outer surface. Liquid layers are then dispensed with ultrathin thickness onto the substrates while moving through the equipment.

Figure 2A:
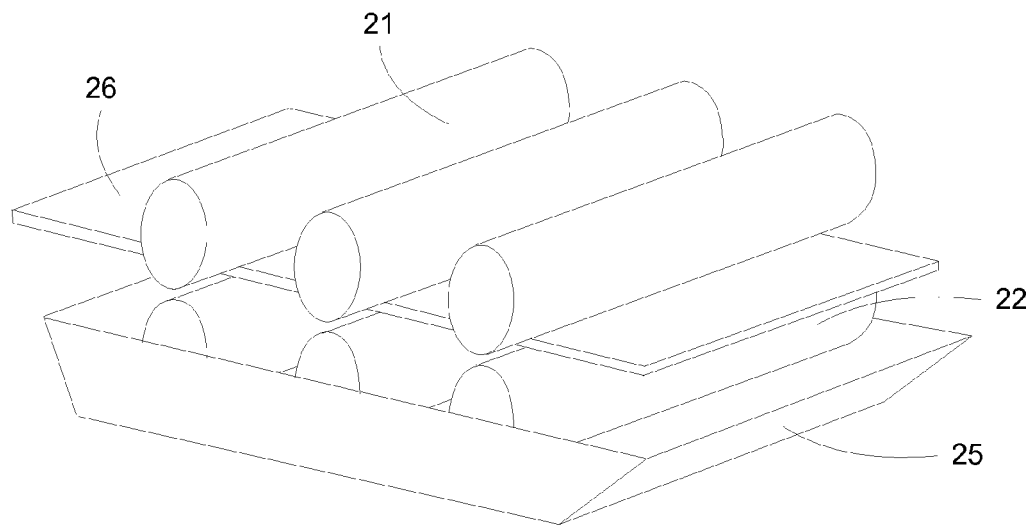
FIGS. 2A-2B illustrate exemplary schematics of the basic coating method and apparatus concept according to an embodiment of the present invention.
Figure 2B:
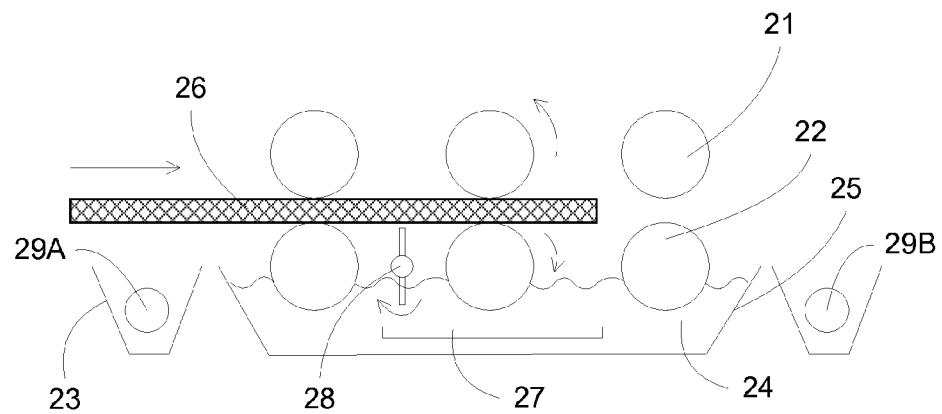

FIGS. 2A and 2B illustrate an exemplary schematic of basic equipment concept according to an embodiment of the present invention. The media 24 are supplied to a container 25. Rollers 21 and 22 having soft porous layers contacting the media 24, which are wetted uniformly due to their material behavior. The dispense of media onto the substrate 26 is controlled by the contact pressure due to the spacing between the top rollers 21 and the bottom rollers 22 in a way to deposit a thin uniform film on the top and bottom surfaces of the substrate 26. Alternatively, only rollers 22 are present, coating only the bottom surface of substrate 26. In rotating the rollers 21 and 22, the substrates are transported from one end of the equipment to the other end of the equipment, in addition to gaining a coating of liquid supplied from the rollers' wet surfaces.

In some embodiments, the porous rollers comprise a rigid core surrounded by a layer of porous material such as a sponge material. The rigid core preferably has adequate stiffness and horizontal flatness across the deposition area of the substrates to ensure uniform deposition of the coating layer. The core material can be metal, alloys, carbon, glass, ceramic, or plastic such as PVC, PP or fluorocarbons.

The porous material can be polymer or polymer foams or sponge, such as PVA, Poly urethane and poly olefin, or can be any materials with pores to allow the liquid media to pass through. In addition, the porous material can be a soft material, which can help in relaxing the requirement of the horizontal flatness of the rigid core.

In some embodiments, the present system comprises one or more temperature control devices, such as heaters or coolers, to provide thermal energy to the substrates or to the chemicals. Some chemicals may require high temperature (e.g., higher than room temperature) before a successful coating, thus heaters can be used to heat the chemicals to a desired temperature. Some chemicals may require low temperature (e.g., temperature lower than room temperature) for coating or for preserving the chemicals, thus coolers can be used to chill the chemicals to a desired temperature. For example, the heaters/coolers can be disposed at the chemical reservoir, at the liquid delivery line, or at the rollers to heat or cool the chemicals directly. In addition, or alternatively, the heaters/coolers can also be disposed at or near the rollers to heat/cool the rollers' surfaces, thus heating or cooling the chemicals when they reach the rollers' surfaces.

Heating or cooling can also be directed to the substrates. For example for deposition of emulgated solid salts to form absorber layers like CdS and ZnS in thin film solar cell manufacturing, the chemicals is heated after deposition, to accelerate the reactions of the chemicals, to dry the liquid chemicals, or to anneal the coating layers. The heaters can be disposed at or near the substrates to heat the substrates' surface, including IR or UV lamps disposed on top and/or bottom of the substrates, or between the rollers. In addition, both heaters and coolers can be used. For example, in deposition of absorber layers, the chemicals are preferably cooled, e.g., by coolers disposed at or near the chemical reservoir or delivery line, to around or below room temperature to preserve the life time of the chemicals. The chemicals are then heated, e.g., by IR heating the substrates, after deposited on the substrates to form the absorber layers.

In some embodiments, the present invention discloses methods and systems for coating substrates with sensitive chemicals, for example, chemicals that are degraded, e.g., crystallization, by exposing to high temperature. In some embodiments, the chemicals are cooled to below temperature, for example, lower than 15 C, and preferably lower than 10 C, such as at about 7 C. The cooling temperature depends on chemicals. A cooling device 27, such as a refrigeration unit, is disposed in the liquid media 24, providing a constant low temperature to the media 24. A stirring mechanism, such as a paddle 28, can be included to equalize the temperature within the liquid container 25, preventing hot spots.

In some embodiments, the coating of the media 24 is performed at high temperature. Heaters 29A can be provided to heat the substrate 26 for processing. Shielding 23 can be included to direct the thermal energy to the substrate 26, preventing the heat from approaching the liquid media 24. Additional heaters 29B can be included for post processing, such as drying or annealing. Heaters can be disposed near the rollers to heat the substrate with shielding to direct thermal energy to the substrate. Heaters can be disposed between consecutive rollers, at the top of the substrates, at the bottom of the substrates, or both.

Figure 3A:
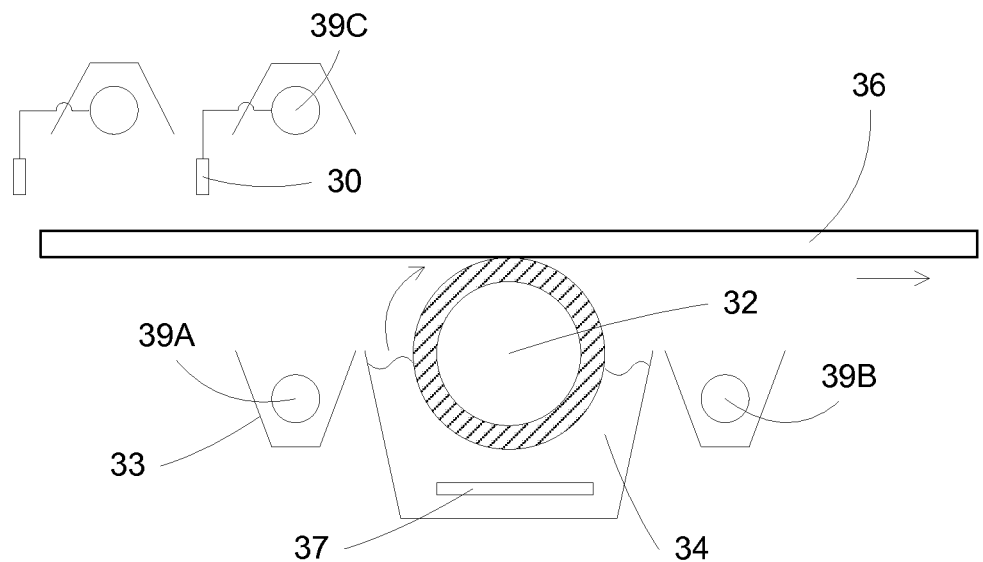
FIGS. 3A-3B illustrate various heater configurations for the coating system according to an embodiment of the present invention.
Figure 3B:
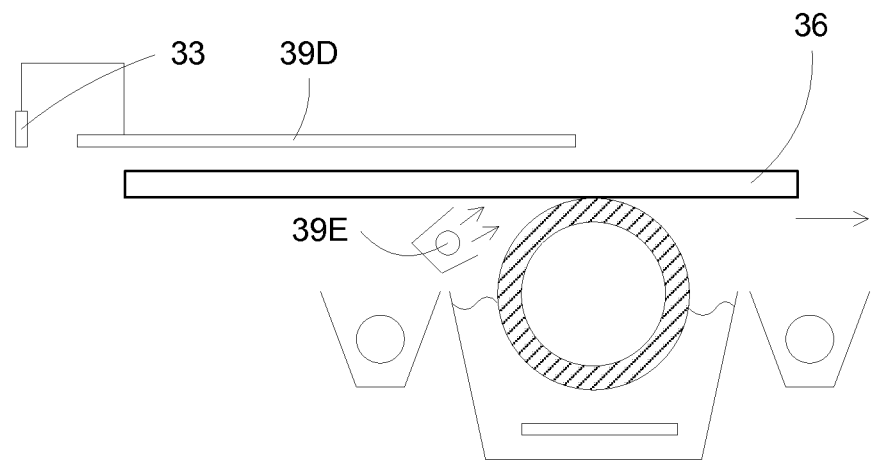

FIGS. 3A-3B illustrate various heater configurations for the coating system according to an embodiment of the present invention. FIG. 3A shows a roller 32 contacting a fluid media 34, which is distributed to the outer surfaces of the roller. When contacting substrate 36, the fluid media is transferred to the contacting surface, forming a liquid layer. The roller 32 can rotate for better spreading the fluid on the substrate surface. Cooling device 37 is provided for keeping the media 34 at a desired temperature, preferably a temperature that prevents degradation of the media 34.

One or more heaters 39A can be positioned before the rollers 32 to heat the substrate 36 at the same coating surface. Shielding 33 can serve to shield the liquid media 34 from the heat. One or more heaters 39C can be included for heating the substrate 36, for example, from the back side. Sensor 30 for detecting the presence of the substrate 36 can be included to turn on the heaters 39C when there is a substrate. This can prevent heaters 39C from heating the liquid media when there is no substrate present. Heater 39B can be included to conditioning the coating after being coated.

In FIG. 3B, one or more heaters 39E can be included for hearing at the interface between the substrate 36 and the roller 32. Heaters 39E can provide thermal energy at point-of-use, meaning at the locations where heat is needed for coating. The heaters can be lamp heaters. Alternatively, resistive heaters can be used, such as heater 39D, disposed along the backside of the substrate 36, Sensor 33 can be included to turn on the heater 39D when substrate 36 is present.

FIGS. 4A-4C illustrate exemplary configurations for temperature control devices according to an embodiment of the present invention. FIG. 4A shows a roller 77 having foam or solidified foam 71 covering a large portion of the outer surface. A temperature control device such as heater or cooler 82 can be disposed in the vicinity of the chemical delivery line, such as wrapping around the piping line, to heat/cool the chemicals to a desirable temperature. A heater/cooler 81 can be disposed in the vicinity of the roller outer surface, such as attaching to an exposed end of the roller, or disposed along the roller 77 under the foam layer 71. A heater/cooler 83 can be disposed inside the roller 77 to heat/cool the roller or to heat/cool the chemical reaching the roller. Any combinations of heaters and coolers can be used.

FIG. 4B shows heater/cooler 84 disposed inside the roller 77, such as attached to the inner surface of a hollow roller. FIG. 4C shows heater/cooler 85 disposed in the middle of the roller 77, heating/cooling the roller and the chemicals in the chemical pockets 86.

FIGS. 5A-5C illustrate exemplary coating processes according to an embodiment of the present invention. FIG. 5A shows the roller 61 receiving liquid media 64 and distributed to porous layer 65. During direct contact with substrate 66, the liquid media is transferred to the substrate surface, forming layer 64*. The roller 61 rotates to provide an even coating, and at the same time, moving the substrate forward. FIGS. 5B and 5C show roller 61 in indirect contact with substrate 66, through intermediate rollers 62, 62A and 62B.

Uniformity of the coating layers can be controlled by adjusting the liquid media available at the surfaces of the rollers. In general, an even distribution of the liquid media along the length of the roller can create a uniform coating on the substrates along the direction perpendicular to the path of travel. Using multiple rollers, the uniformity along the direction of travel can be further improved.

Figure 6A:
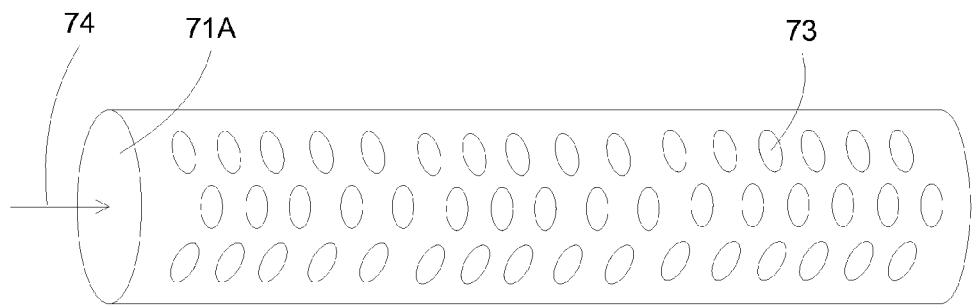
FIGS. 6A-6D illustrate exemplary rollers for uniform deposition according to an embodiment of the present invention.
Figure 6B:
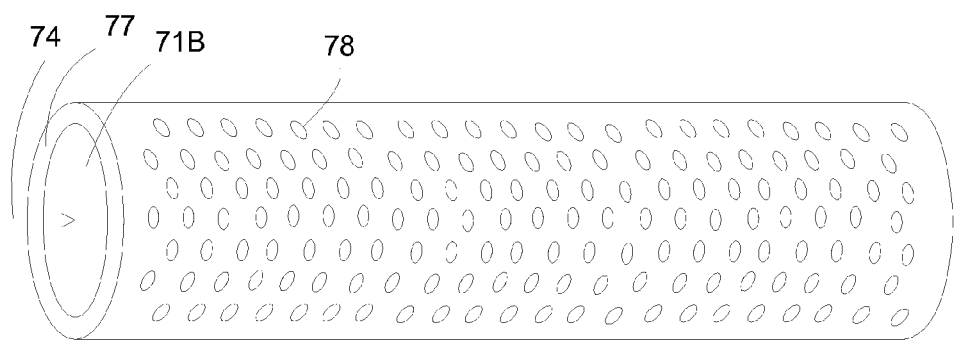
Figure 6C:
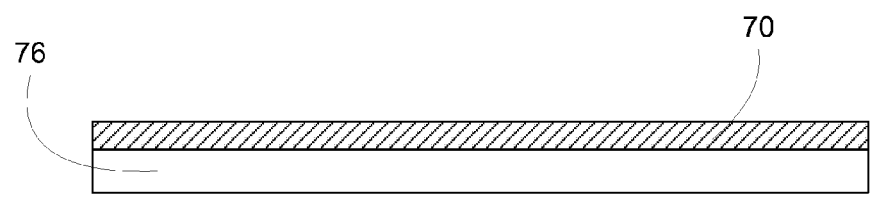
Figure 6D:
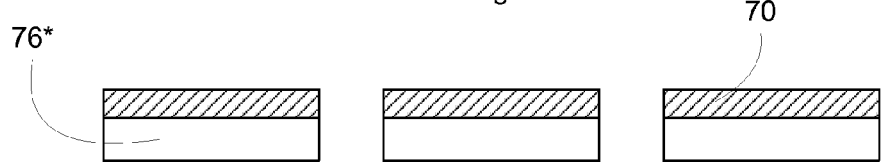

FIGS. 6A-6D illustrate exemplary rollers for uniform deposition according to an embodiment of the present invention. FIG. 6A shows roller 71A with uniform distribution of perforation holes 73 along the length of the roller. When the liquid media 74 enters the roller 71A at one end (e.g., at the extreme end, or at a vicinity of the extreme end), the uniform distribution of perforation holes can enable a uniform distribution of liquid media on the substrate surfaces. The perforation holes are shown also with uniform distribution along the circumference of the roller, other configurations can be equally effective, such as multiple perforated tubing. FIG. 6B shows roller 71B comprising porous layer 77 having uniform distribution of pore sizes or pore densities 78 along the length of the porous layer 77. Porous layer 77 can be a foam or sponge material, with the pores 78 characterized by the pore size or pore density. Porous layer 77 can be a liquid permeable layer, having uniform permeability along the length of the roller. Having a uniform distribution of liquid media, the coating layer 70 on a large substrate 76 can be uniform across the width of the substrate (FIG. 6C), or the coating 70* can be uniform and similar for multiple substrates 76* disposed along the length of the roller.

Figure 7A:
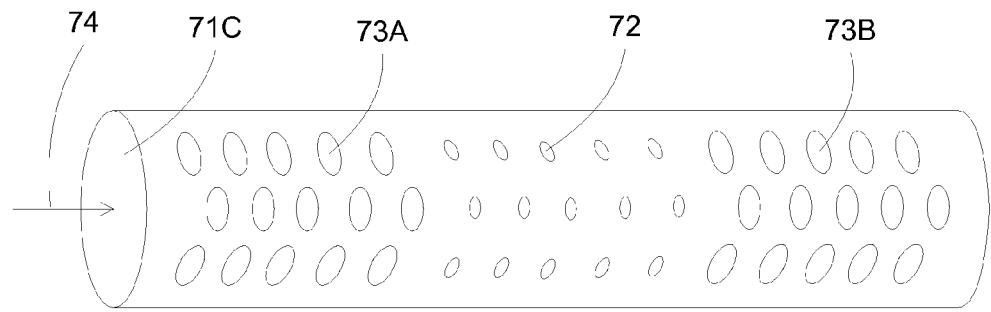
FIGS. 7A-7I illustrate exemplary rollers for non-uniform deposition according to an embodiment of the present invention.
Figure 7B:
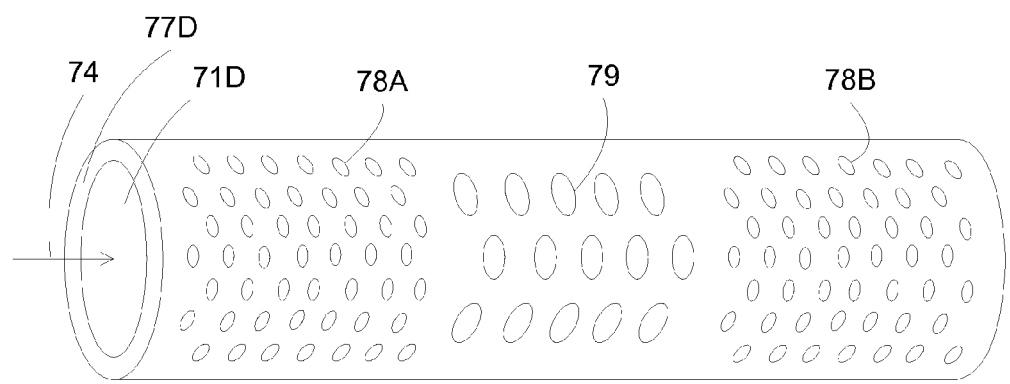
Figure 7C:
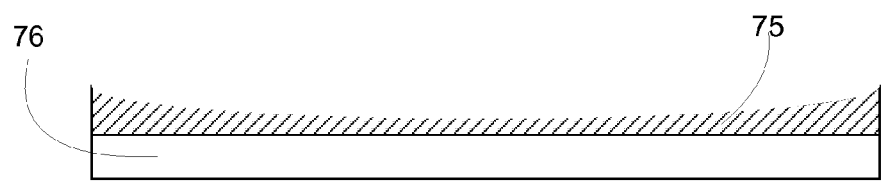
Figure 7D:
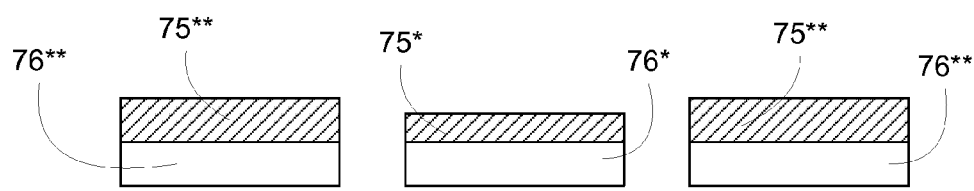

FIGS. 7A-7G illustrate exemplary rollers for non-uniform deposition according to an embodiment of the present invention. FIG. 7A shows roller 71C with different distributions of perforation holes 72 and 73A/73B along the length of the roller. With larger holes 73A/73B at the edges of the roller, as compared to smaller holes 72 in the middle, more liquid can be transferred to the substrates at the edges, creating thicker coating at the edges. Practically any desired distribution of coating thickness can be achieved with appropriate distribution of perforation holes 72/73A/73B. In another configuration, FIG. 7B shows roller 71D comprising porous layer 77D having non-uniform distribution of pore sizes or pore densities 79/78A/78B along the length of the porous layer 77D. Similarly, the porous 77D can generate any desirable distribution of coating thickness, such as a distribution 75 on substrate 76 (FIG. 7C), or thicker coating 75 on outer-edge substrates 76** as compared to thinner coating 75* on inner substrates 76*(FIG. 7D**).

Figure 7E:
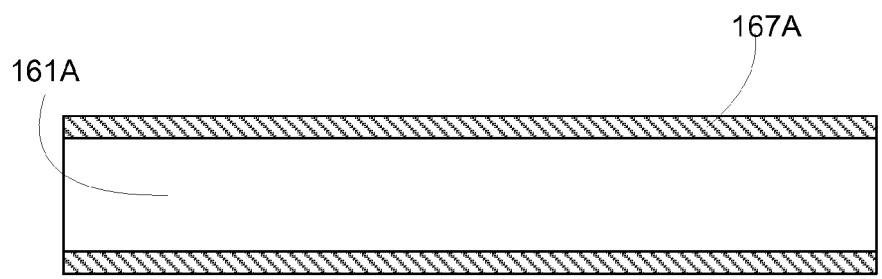

FIGS. 7E-7I illustrate exemplary roller profiles according to an embodiment of the present invention. In FIG. 7E, the roller comprises a cylindrical core 161A and a porous layer 167A covering the outer surface of the core 161A. The core 161A and the porous layer 167A have uniform profiles, e.g., straight cylinder for the core 161A and equal thickness for the porous layer 167A. Profile distribution of the liquid can be accomplished through the distribution of perforation holes in the core 161A or through the pore density of the porous layer 167A along the length of the roller.

Figure 7F:
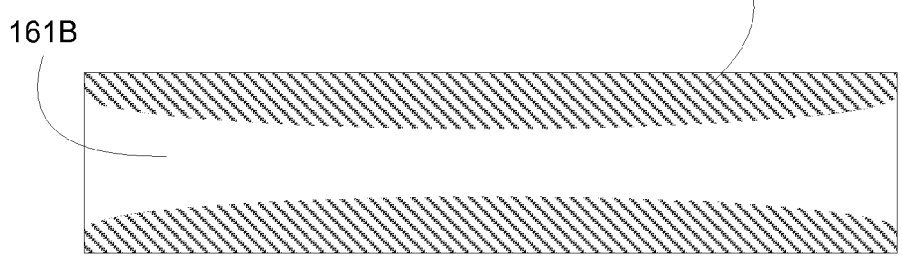
Figure 7G:
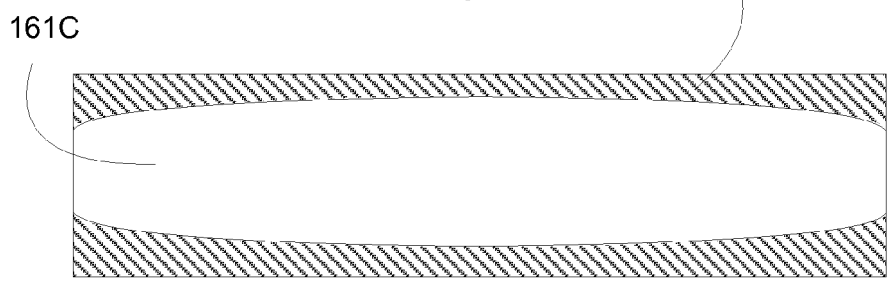

In FIG. 7F, the roller comprises a cylindrical core 161B having a concave inward surface, together with a mated porous layer 167B having thicker layer at the middle than at the ends. The structure of the complete roller (e.g., including core 171B and porous layer 176B) preferably forms a straight cylindrical surface, in order to rollingly contact the substrate. In this configuration, coating thickness can be varied along the length of the roller. For example, for high compression, the end portions are squeezed much more than the middle portion, resulting in more liquid coating at the end portions. For light compression, more fluid is stored in the middle portion (due to thicker porous layer), and can result in more fluid at the middle portion. In FIG. 7G, the roller comprises a cylindrical core 161C having a concave outward surface (or convex), together with a mated porous layer 167C having thinner layer at the middle than at the ends.

Figure 7H:
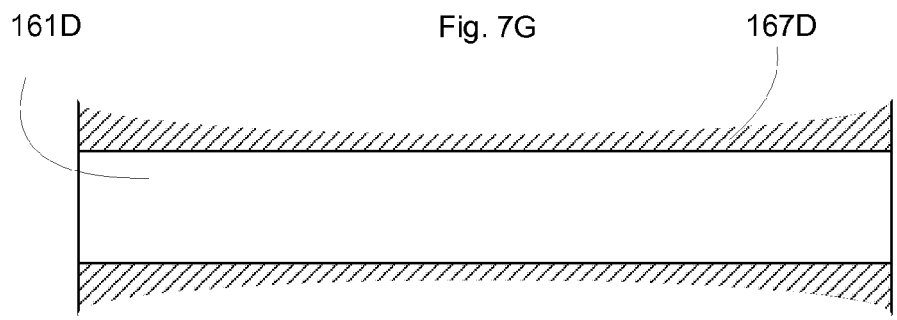
Figure 7I:
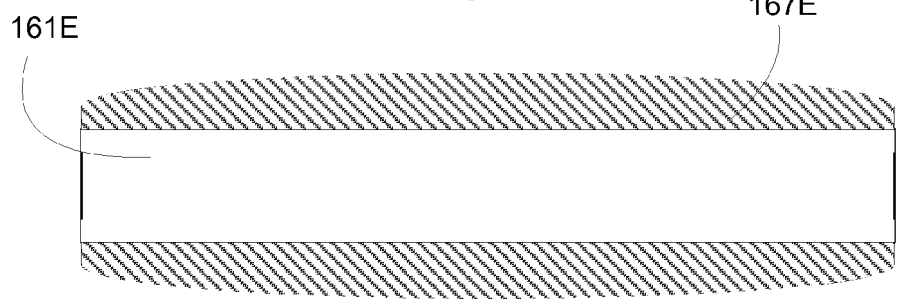

In FIG. 7H, the roller comprises a cylindrical core 161D having a straight surface, together with a concave inward porous layer 167D having thinner layer at the middle than at the ends. In this configuration, with flat substrates, the end portions are compressed more than the middle portion, resulting in more fluid coating at the ends. In FIG. 7I, the roller comprises a cylindrical core 161E having a straight surface, together with a concave outward porous layer 167E having thicker layer at the middle than at the ends. These configurations are exemplary. Other configurations can be used to achieve a desired thickness profile of coating (uniform or non-uniform) along the length of the roller. For example, the rollers may have diameter variations.

In some embodiments, the non-uniform profile of the thickness across the doper is designed to compensate for the non-uniform profile of a subsequent process. An example is the dopant diffusion process. After coating the substrates with a dopant layer, the substrates are annealed in a furnace to drive the dopant into the substrates. For in-line processing, after dopant coating, the substrates will move into an inline furnace with the same arrangements (rows) as they have been in the doper. It is costly to make the temperature in the furnace perfectly uniform in the direction perpendicular to the path of the substrates. For example, the temperature can be higher at the center than at the edge due to the boundary heat loss. This temperature difference can result in different substrate qualities according to their locations inside the furnace, for example, more dopant can be diffused to the substrates at the center than at the edges of the furnace.

The present rollers having core design with multiple types of perforations to apply a non-uniform coating layer on the substrates can compensate for this temperature difference to generate a homogeneous quality of the substrates after the furnace. For example, more chemical can be applied to the substrates at the edges of the doper, resulting in a thicker layer of coating, as compared to the substrates at the center of the doper. Thicker coating layers contain more dopant, which can be used to compensate for the lower temperature in the anneal furnace. Thus substrates positioned at the edges and at the center of the in-line conveyor (which is used to move the substrates from one location to another location) can have similar dopant concentration regardless of the temperature profile in the anneal furnace. Further, the coating layers can be removed after the anneal process, and thus the substrates remain uniform in surface topology.

In some embodiments, the present invention discloses an in-line deposition system comprising rollers contacting a cool liquid and distributing the liquid to the outer surfaces. The deposition coating with the present rollers can be performed on both sides of the substrate, or can be applied to only one side. In addition, other types of coating can be included. The substrates can be transported with an in-line transport, such as any type of conveyor or ceramic rollers, to the liquid rollers to be coated, and then to an outlet in-line transport to subsequent processes such as an anneal furnace. Other components can be implemented, for example, exhaust and isolation to prevent hazardous gas from escaping, temperature isolation to provide wall safety, carrier gas and curtain gas for atmospheric isolation and purging, substrate conditioning before removal from the process chamber, such as a drying environment, and spray cleaning system for system cleaning.

Figure 8A:
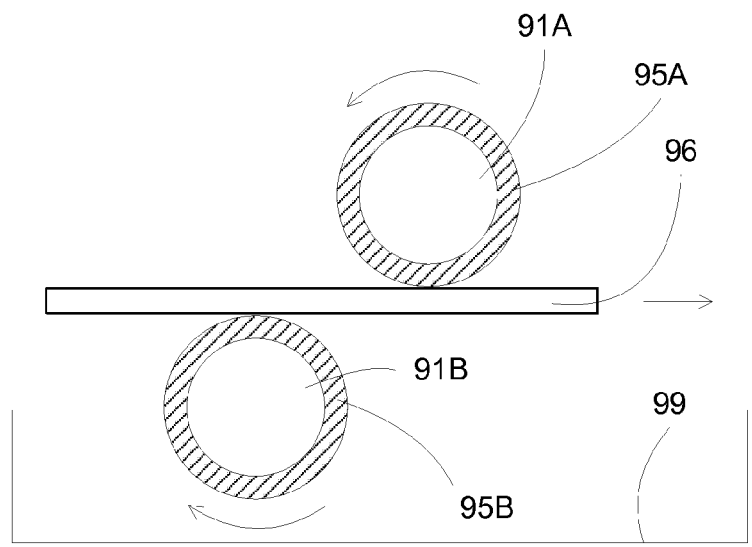
FIGS. 8A-8C illustrate exemplary configurations for liquid coating according to an embodiment of the present invention.
Figure 8B:
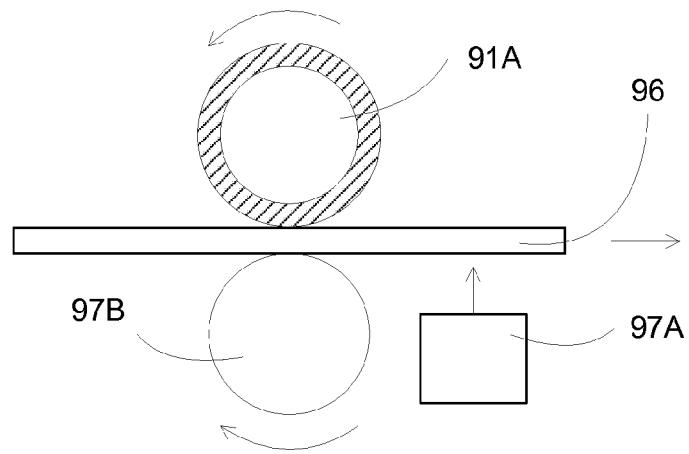
Figure 8C:
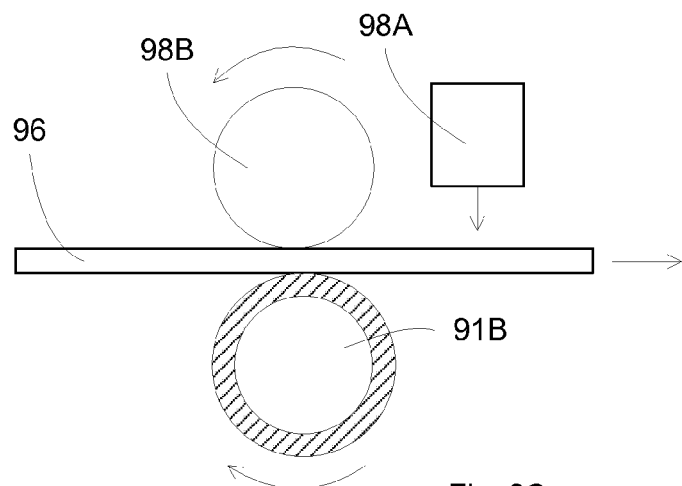

FIGS. 8A-8C illustrate exemplary configurations for liquid coating according to an embodiment of the present invention. FIG. 8A shows a substrate 96 sandwiched between two rotating rollers 91A and 91B. The rollers accept a liquid media, for example, from a reservoir 99, and distributing to the rollers' surface. Foam or solidified foam layers 95A and 95B cover the outer surfaces of the rollers, and receive the liquid media from the roller surfaces to be transferred to the substrate 96. With rollers at the top and bottom of the substrate, both sides of the substrate can be coated simultaneously. In addition, the rollers can move the substrate forward, thus acting as transport rollers.

The liquid media flowing to the rollers 91A/91B can be controlled to perform a desired coating on the substrate 96 with minimum excess waste. In addition, the separation of the rollers can be controlled to exert appropriate contact pressure to the substrate 96 to minimize the wasted liquid. For example, a spring can be positioned on top roller 91A to provide a desired pressure to the substrate 96. The multiple independent control mechanisms can eliminate or minimize the excess fluid on the substrate surfaces, such as providing a uniform coating without any liquid droplets. The bottom roller 91B can be fixed around the axis of rotation, and rotated to coat the bottom surface of the substrate, together with forward substrate movement.

FIG. 8B shows a roller 91A disposed at top of substrate 96 to deposit a coating layer on the top surface. The bottom surface can have no coating, or have a coating from another coating process 97A. The other coating process can be a liquid spray coating comprising a nozzle delivering chemical media in aerosol or liquid form and with or without carrier gas or solvent, or sponge rollers dipped in liquid chemical media. In addition, the bottom surface can be supported by roller 97B, which can be transport rollers or non liquid-supplied rollers. The roller 97B can be used for transporting the substrate forward, or for exerting contact pressure between the liquid-supplied roller 91A and the substrate 96.

FIG. 8C shows a roller 91B disposed at bottom of substrate 96 to deposit a coating layer on the bottom surface. The top surface can have no coating, or have a coating from another coating process 98A. The bottom liquid roller 91A can be used as transport roller for moving the substrates. In addition, roller 98B can be provided on top of the substrate, which can be non liquid-supplied rollers, and can serve to exert contact pressure between the liquid-supplied roller 91B and the substrate 96.

In some embodiments, all rollers can accept the same liquid media from a single reservoir. Alternatively, different rollers can accept different liquid media from multiple reservoirs. Different chemicals can be deposited on top and bottom surfaces. Different chemicals can be deposited on a same surface for a coating mixture. Filling rollers, e.g., rollers without accepting a liquid flow, can be included for other purposes, such as improved media distribution. The liquid media can be all distributed from a single reservoir, or can be individually provided from multiple reservoirs. Flow distribution mechanisms, for example, for the reservoir, can be included, such as pumping mechanism, pressure controller, flow controller and distribution manifold. Recirculating mechanism and automatic refilling can also be included.

In some embodiments, the present invention discloses maintaining the fluid media that is used to provide coating to substrate at low temperature, such as lower than room temperature, preferably lower than 10 C, such as at about 7 C. The specific temperature depends on the fluid media, designed to prevent rapid degradation. For example, during the coating of CdS, liquid media containing Cd, and optionally S, is used to coat substrates at high temperature. At room temperature and above, the liquid media can quickly re-crystallize, degrading the media and requiring clean up and media replacement. The low temperature can be established by a cooling device disposed at liquid media reservoir to keep the media at a low temperature until reaching the rollers.

In some embodiments, the present invention discloses creating a temperature barrier or gradient for the liquid media surrounding the rollers. Away from the rollers, the liquid media is maintained at a low temperature to prevent degradation. At the vicinity of the rollers, the liquid media is maintained at a temperature suitable for process, such as a high temperature (similar to the coating temperature, or the temperature of the substrate) to ease the coating process, or a medium temperature (somewhere between the high temperature of the substrate and the low temperature of the liquid media far away from the rollers) to provide a transition between the low temperature to the high temperature. The temperature gradient region is preferably small, such as less than 10 cm, preferably less than 5 cm, or less 1-2 cm. The temperature gradient region can be established by a temperature device, such as a cooling device disposed in a vicinity of the rollers, to ensure that the liquid leaving the rollers is kept at a low temperature. The temperature device can also comprise a heater disposed in a vicinity of the rollers, to ensure that the liquid entering the rollers is kept at the desired temperature, e.g., high or medium temperature. A Peltier device can be used, which provides a cooling side to the liquid container and a heating side to the roller surfaces. Additional cooling devices or heating devices can be added, if more cooling or more heating, respectively, is needed.

In some embodiments, the temperature gradient region comprises an energy barrier, allowing fluid media to move freely across the boundary. Heating energy is provided when fluid enters the temperature gradient region near the rollers to reach the high to medium temperature. Cooling energy (e.g., heat removing device) is provided when fluid leaves the temperature gradient region to return to the low temperature of the liquid reservoir. In some embodiments, the temperature gradient region comprises a partial physical barrier, for example, one that is created by the temperature controlling device.

In some embodiments, the present invention discloses creating small container volume surrounding the rollers, for example, to limit the high or medium temperature exposure to a smaller volume of liquid media. The liquid in the small container can be kept at high temperature or medium temperature to accommodate the coating process, while the rest of the container is maintained at low temperature for media preservation. The small container can be shaped surrounding the submerged surfaces of the rollers, and less than 10 cm, preferably less than 5 cm, and more preferably less than 1 or 2 cm. Restricted fluid communication of the small container with the liquid reservoir can be added, for example, to maintain the temperature gradient. For example, one way entrance to the small volume can be incorporated to the small volume container. Or energy barrier can be established at the entrance to ensure a temperature gradient. Or a membrane can be used for the fluid communication with the small volume container.

In some embodiments, the temperature of the liquid media in the reservoir is equalized, for example, to remove any hot spots which can potential degrade the chemicals. The temperature equalizer can comprise a stirrer, such as a paddle wheel coupled to the rotational mechanism of the rollers, and thus rotating together with the rollers to stir the liquid media in the reservoir. Other stirrer device such as a magnetic coupled stirrer can be provided to stir the liquid. Liquid circulation can be provided create a liquid flow, mixing the temperature. The liquid circulation can also comprise a filter, filtering particulates such as the re-crystallized particles from the liquid media.

Figure 9A:
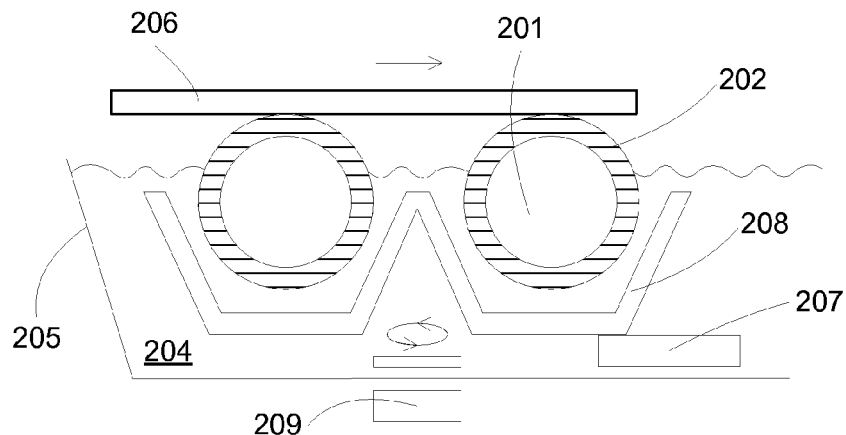
FIGS. 9A-9C illustrate exemplary configurations for temperature barrier according to an embodiment of the present invention.
Figure 9B:
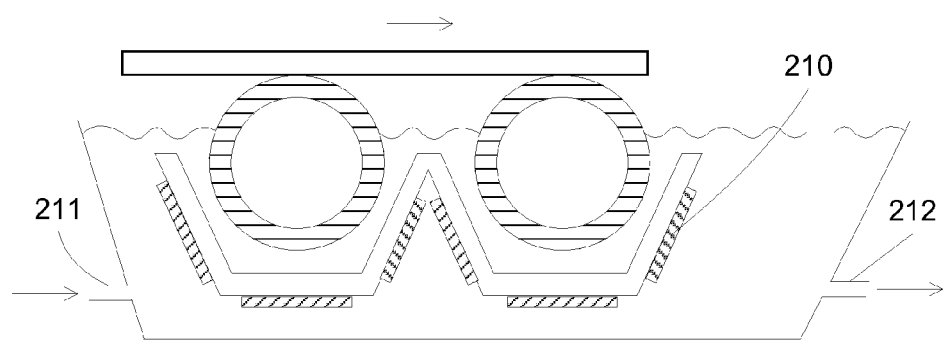
Figure 9C:
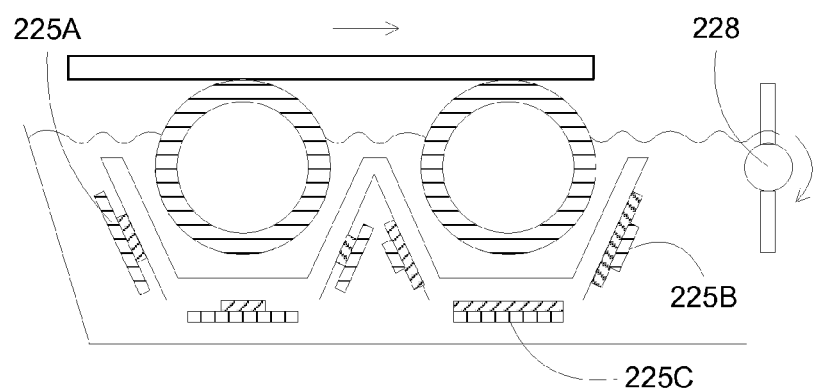

FIGS. 9A-9C illustrate exemplary configurations for temperature barrier according to an embodiment of the present invention. A barrier 208 is disposed around rollers 201, especially around the porous layer 202, for example, to maintain a temperature gradient between the liquid media away from the roller surface and the liquid media in an immediate vicinity of the roller surface. The barrier 208 can be a temperature barrier, e.g., allowing liquid to freely crossing the barrier. For example, the barrier 208 can comprise a mesh, or a bending tubes array surrounding the rollers 201. The barrier 208 can be coupled to a temperature controlling device, such as a heater/cooling device 207 to maintain a low temperature barrier around the rollers.

In FIG. 9A, liquid media 204 is disposed in a liquid reservoir or container 205, providing liquid to the rollers 201 through the porous layer 202. The rollers 201 then contact the substrate 206, coating the surface of the substrate with a media coating. Barrier 208 is coupled to a temperature controlling device 207, such as cooling device to maintain a low temperature barrier around the rollers. For example, cooling device 207 can be a refrigeration unit, providing coolant to the barrier 208. Alternatively, the temperature controlling device 207 can be a heating device, maintaining a high or medium temperature barrier around the rollers. In this case, an additional cooling device (not shown) can be provided to maintain the rest of the liquid media at low temperature. The barrier 208 preferably allows the liquid to enter and leaving the volume in a vicinity of the roller surfaces, for example, by forming a mesh or an array of tubing. The separation of the mesh of the tubing is such that the liquid can easily communicate while subjected to the energy of the mesh or tubing, e.g., the mesh or tubing controls the temperature of the liquid entering or leaving the area. A stirring mechanism, such as a magnetic stirrer system 209, can be coupled to the liquid to create a flow, effectively equalizing the temperature within the reservoir 205.

In some embodiments, the substrate 206 is heated to a process temperature so that when the rollers 201 contact the substrate 206, a coating is formed on the contacted surface. In some embodiments, a hot media is preferred at the contact surface between the substrate 206 and the rollers, for example, a hot media is absorbed in the porous layer 202 of the rollers 201. In some cases, high temperature is detrimental to the media after prolong exposure, for example, CdS film solutions can undergo re-crystallization at high temperature, reducing their effectiveness in the coating process. Thus the present invention provides cooling device 207 at the bulk area of the media, keeping the media at a temperature that can preserve their lifetime and effectiveness. In addition, in some embodiments, the present invention further discloses a temperature barrier 208, to reduce the portion of the media that has the high temperature, thus also limiting the potential damage to the media.

In some embodiments, the liquid media within the temperature barrier is maintained at a temperature suitable for the coating process. The temperature barrier can be at the process temperature, e.g., the temperature of the substrate 206. A high temperature gradient is then established at the barrier 208, transitioning the media from the high process temperature near the roller surface to the cool media-preserving temperature away from the barrier. The barrier 208 is preferably disposed near the roller surface to limit the volume of the media that is exposed to the high process temperature. The high temperature can be supplied by heating the rollers 201, for example, heating the roller core at an end or at a hollow center. The high temperature can be supplied by heating the media at the immediate volume surrounding the roller outer surfaces.

In some embodiments, the temperature barrier can be at an intermediate temperature, which is lower then the process temperature, for example, at a temperature between the process temperature and room temperature, or a temperature between the process temperature and the low media-preserving temperature of the bulk media. For example, the media contained in the temperature barrier can be maintained at room temperature, higher or lower than room temperature. With the media in the roller porous layer 202 maintained at the intermediate temperature, the coating process can still maintain its effectiveness while the life-preserving media can be greatly improved. Similarly, the intermediate temperature can be supplied by heating the rollers or by heating the media at the immediate volume surrounding the roller outer surfaces. Alternatively, the intermediate temperature can be supplied by the residue heat transferred from heaters heating the substrate 206, or from the rollers 201 contacting the hot substrate 206 to the liquid media.

In FIG. 9B, temperature controlling devices 210 are attached to the temperature barrier. The temperature controlling devices 210 can be cooling devices, providing a cooling barrier to the media leaving the roller immediate area, ensuring that the bulk media is maintained at the low media-preserving temperature. The media at the vicinity of the roller surface can be heated by the rollers, or by the residue heat transferred from heaters heating the substrate 206, or from the rollers 201 contacting the hot substrate 206 to the liquid media. The temperature controlling devices 210 can be heating devices, heating the media to be supplied to the roller layer 202. In some embodiments, addition cooling devices (not shown) are included to cool the bulk media. Temperature equalizing devices such as media circulation or re-circulation can be used, comprising a media tank and a pump pumping media to inlet 211, and flowing to outlet 212 before returning to the media tank. Filters can be included in the flowing path.

In FIG. 9C, temperature controlling devices 225A-225C are Peltier devices attached to the temperature barrier. The Peltier devices can have one side hot and another side cold. The hot side can face the rollers and the cold side faces the bulk media. The Peltier devices can act as heater to heat the immediate area surrounding the roller surfaces, and can also act as a cooler to cool the bulk liquid media away from the rollers. The Peltier can be encapsulated to be protected from the media environment. Paddler 228 can be used to equalize the media temperature, for example, by create a liquid movement within the container 205.

Additional heaters or coolers can be incorporated with, or in a vicinity of, the Peltier devices to control the heating or cooling energy. For example, if more cooling is desired, additional cooler can be added (element 225A). If more heat is desired, additional heater can be added (element 225B). Similar hot and cool sides can be used (element 225C).

Figure 10A:
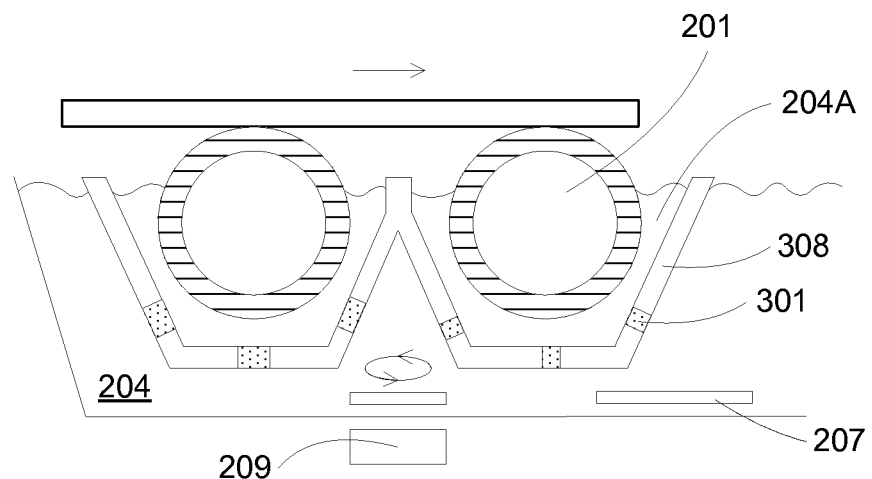
FIGS. 10A-10B illustrate exemplary configurations for physical barrier according to an embodiment of the present invention.
Figure 10B:
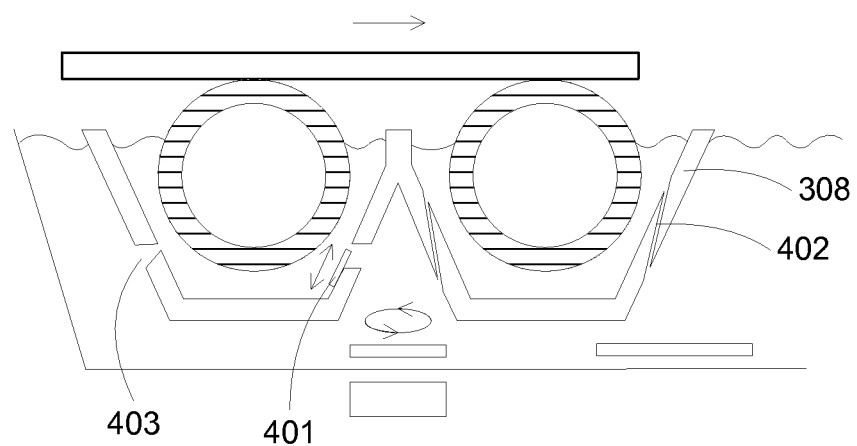

FIGS. 10A-10B illustrate exemplary configurations for physical barrier according to an embodiment of the present invention. In FIG. 10A, a physical barrier 308 is disposed around rollers 201, forming an isolated volume for the media 204A. Restricted openings 301 can be provided. For example, membranes 301 can allow media 204 to enter the barrier 308. Membrane 308 can limit the liquid media exchange, allowing a temperature gradient between the media 204A near the roller surface and the bulk media 204. Cooling devices can be added, such as device 207. Other temperature controlling devices can be added, to assist in establishing a temperature gradient for the physical barrier 308. Temperature equalizing devices 209 can also be added.

In FIG. 10B, narrow splits 402 can be used to control the media exchange across the barrier 308. Restricted opening 403 with larger end facing the bulk media 204 and smaller end facing the roller can be used. In addition, controllable opening 401 can be used to statically or dynamically change the opening size.

Figure 11A:
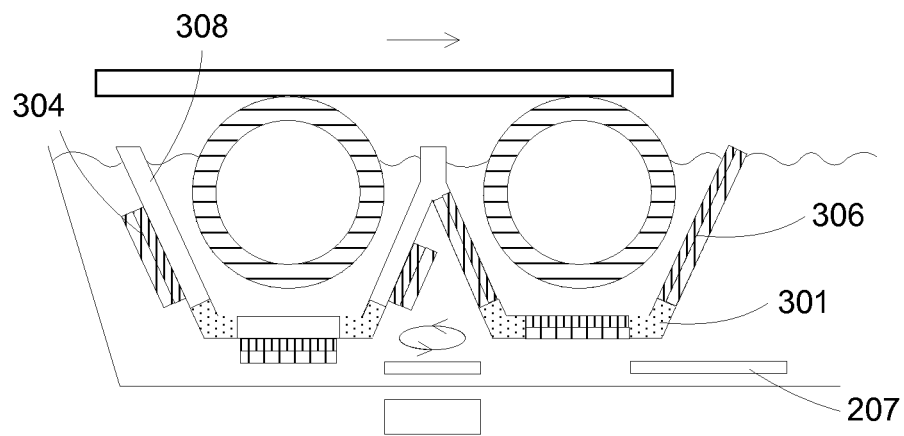
FIGS. 11A-11B illustrate other exemplary configurations for physical barrier according to an embodiment of the present invention.
Figure 11B:
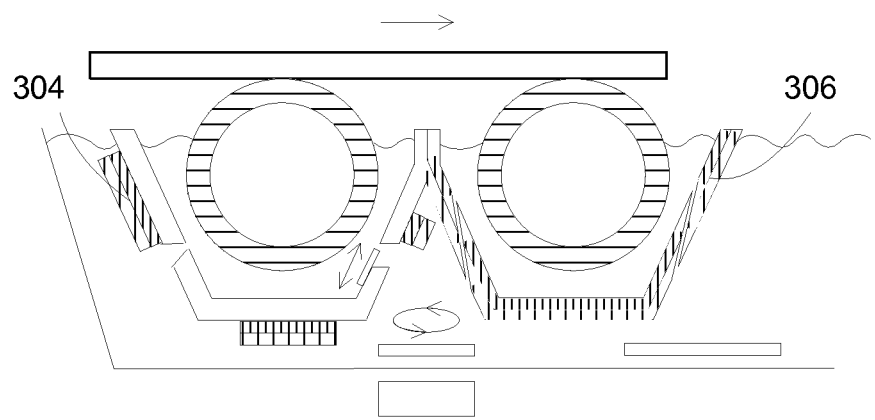

FIGS. 11A-11B illustrate other exemplary configurations for physical barrier according to an embodiment of the present invention. Temperature controlling devices 304 and 306 can be attached to the barrier 308 to control the temperature gradient. For example, Peltier devices 304 are attached to the barrier 308. Additional heaters or coolers can be incorporated with the Peltier devices to ensure a desired temperature gradient. For example, heater or cooler is added if more heat or more cool energy, respectively, is desired across the barrier. Alternatively, the temperature controlling devices can be incorporated to the barrier 308, such as Peltier devices 306 embedded within the walls of the barrier 308.

Figure 12:
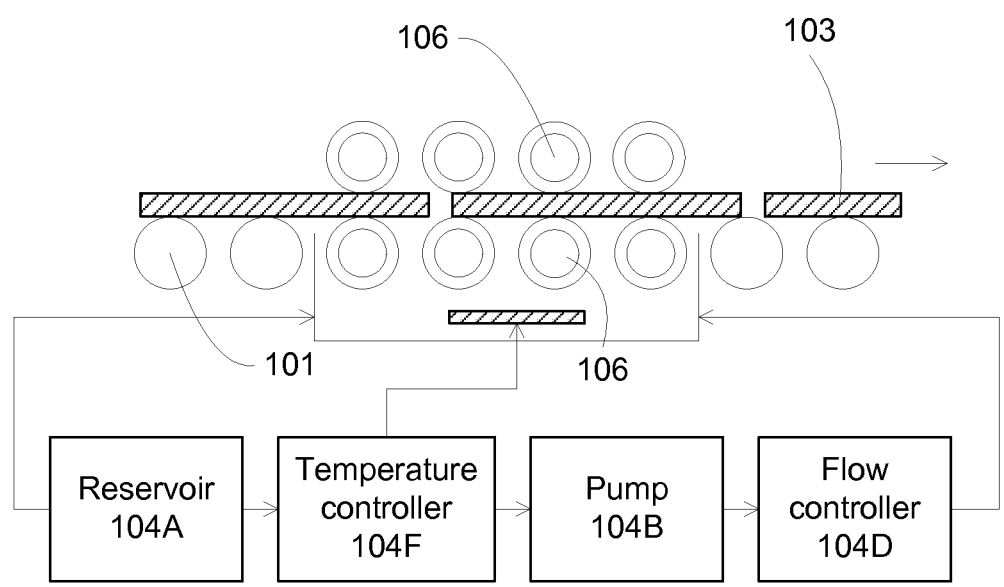
FIG. 12 illustrates an exemplary configuration of liquid media distributions in an in-line deposition system according to an embodiment of the present invention

FIG. 12 illustrates an exemplary configuration of liquid media distributions in an in-line deposition system according to an embodiment of the present invention. Substrates 103 move by rolling conveyor rollers 101. Bottom liquid rollers 106 can replace conveyor rollers 101 to continue moving the substrates forward, together with providing a liquid coating on the bottom surfaces. Top liquid rollers are disposed with appropriate pressure to deposit a top coating with minimum excess liquid residue.

The liquid media can be provided to the rollers from one or more reservoirs. For example, a reservoir 104A containing chemical liquid can provide liquid media to a pump 104B, which can push the liquid media to the container. A flow controller 104D can be added to regulate the pressure and flow to the container. Temperature controller 104F can control heat or cooling to the liquid media and/or the substrates.

The top and bottom rollers can accept different liquid media for different coating material. The top and bottom rollers can rotate at a same speed or at different speeds. For example, for same liquid media on top and bottom rollers, the top and bottom rollers can rotate at a same speed for depositing a similar coating layer on top and bottom surfaces of the substrates. For different liquid media, the top and bottom rollers can rotate at appropriate speeds, which can be the same or different from each other.

Additional rollers can be added. For example, one or more dry rollers can be provided for better liquid media distribution. The dry rollers can be disposed alternate to the liquid rollers, or can be disposed at selected locations. The dry rollers can be rollers without any wetting liquid, roller without accepting liquid from the inside, or rollers with vacuum suction (instead of liquid flowing) to dry the porous layer, or brush rollers.

Figure 13A:
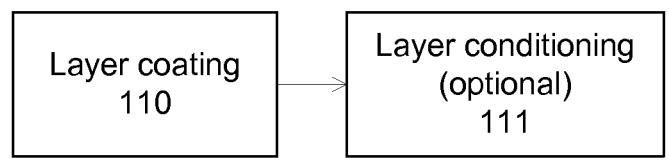
FIGS. 13A-13C illustrate an exemplary deposition process according to an embodiment of the present invention.
Figure 13B:
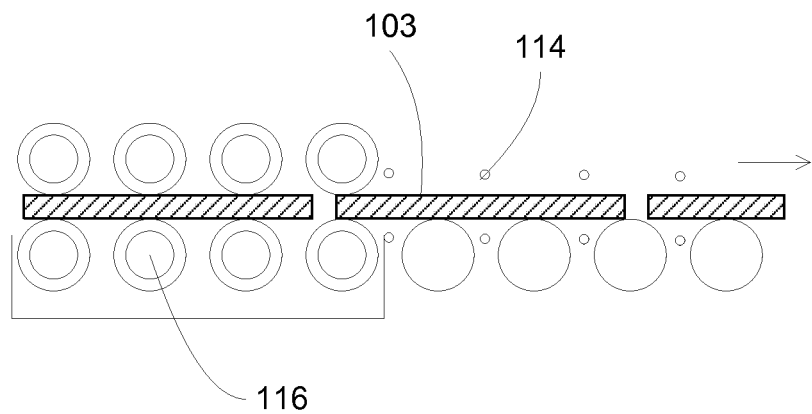
Figure 13C:
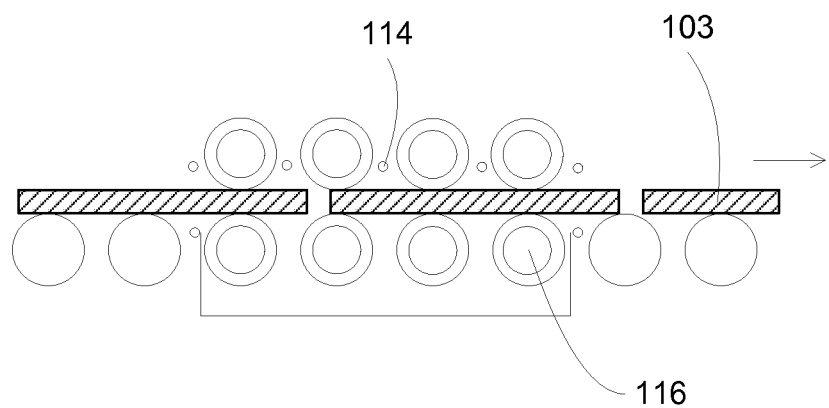

In some embodiments, the present invention discloses deposition processes using liquid media coating. FIGS. 13A-13C illustrate an exemplary deposition process according to an embodiment of the present invention. In FIG. 13A, a substrate is coated 110 with a liquid layer using coating rollers and then optionally underwent a layer conditioning process 111. The layer conditioning process is optional, meaning it will serve to conditioning the deposited layer only if needed. For example, some processes require a liquid layer as deposited and thus no conditioning process is needed. The conditioning process can be a drying process, for example, by a heater or by a drying roller. The drying process is optional, meaning an active drying process is not necessary, for example, the deposition process can be air dried, or the drying process can be embedded in subsequent process, for example, in a subsequent annealing process. The conditioning can be an anneal process, subjecting the coating to an inactive or active ambient to modify the properties of the coating. For example, annealing in a sulfur ambient can incorporate sulfur to the coating, forming CdS films.

FIG. 13B illustrates an exemplary configuration of separate coating and drying, comprising separate coating station comprising liquid rollers 116 and conditioning/drying station comprising heater 114. When the transport rollers transfer the substrates 103 to the coating station, liquid rollers 116 deposit a liquid coating on the substrates. As shown, the liquid rollers deposit coating layers on both top and bottom, with similar rollers, but other configurations can be used. After completing the coating layers, the substrates are transported, by the same bottom liquid rollers 116, to the drying station to be dried by the thermal energy provided by heaters 114. As shown, heaters 114 comprising IR heaters disposed in parallel to the rollers for heating the substrates as the substrates passing through, but other heating configurations can be used, such as different orientations, or different types of heaters.

FIG. 13C illustrates an exemplary configuration of integrated deposition and drying. The coating station and the drying station are integrated to a deposition station, where the heaters 114 and the liquid rollers 116 are disposed next to each other, so that the liquid coating from each roller 116 can be heated immediately by the next heater 114. Other configurations can be used, such as multiple heaters 114 after one liquid roller 116, or one heater 114 after multiple liquid rollers 116.

Figure 14A:
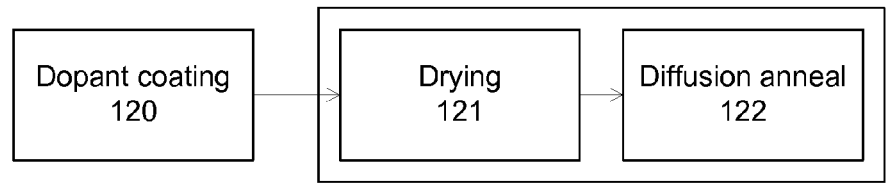
FIGS. 14A-14C illustrate an exemplary deposition process according to an embodiment of the present invention.
Figure 14B:
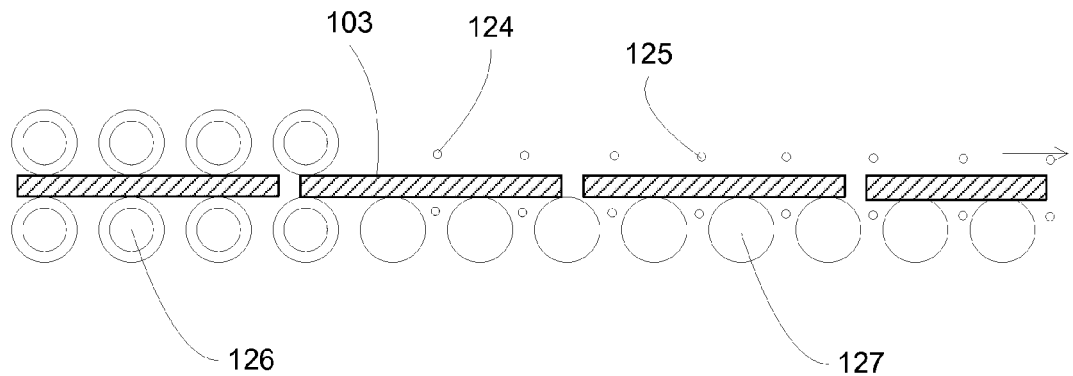
Figure 14C:
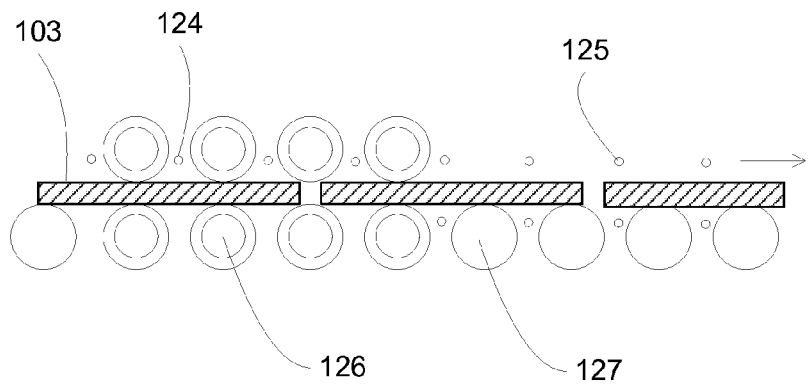

FIGS. 14A-14C illustrate an exemplary deposition process according to an embodiment of the present invention. In FIG. 14A, a substrate is coated 120 with a dopant liquid layer using coating rollers, dried 121 to form a solid layer, and then annealed in a furnace to drive the dopant under the substrate surface. The drying process can be omitted, or can be embedded in the annealing process. FIG. 14B illustrates an exemplary configuration of coating, drying and annealing, comprising separate coating station comprising coating rollers 126 and drying station comprising heater 124. When the transport rollers 127 transfer the substrates 103 to the coating station, coating rollers 126 deposit a liquid coating on the substrates. After completing the coating layers, the substrates are transported, by the same bottom coating rollers 126, to the drying station to be dried by the thermal energy provided by heaters 124. The substrates are then transferred to an anneal furnace using heaters 125.

FIG. 14C illustrates an exemplary configuration of integrated coating and drying. The coating station and the drying station are integrated to a deposition station, where the heaters 124 and the coating rollers 126 are disposed next to each other, so that the liquid coating from each roller 126 can be heated immediately by the next heater 124. After drying, the substrates are annealed by the heaters 125. Alternatively, the drying step can be skipped, or incorporated in the anneal process. For example, the anneal process can include a pre-anneal step before a main anneal step, and the drying process can be included in the pre-anneal step.

In some embodiments, the present invention discloses methods for depositing liquids on substrates, comprising using a roller accepting cool liquid media from a container and migrating the liquid to the outer surfaces for contact coating. The liquid media is kept cooled below room temperature, preferably below 15-10 C, such as at 7C. Temperature equalizer can be included to prevent hot spots. Temperature barrier or physical barrier can also be included to limit the extend of liquid media exposure to high temperature.

Figure 15:
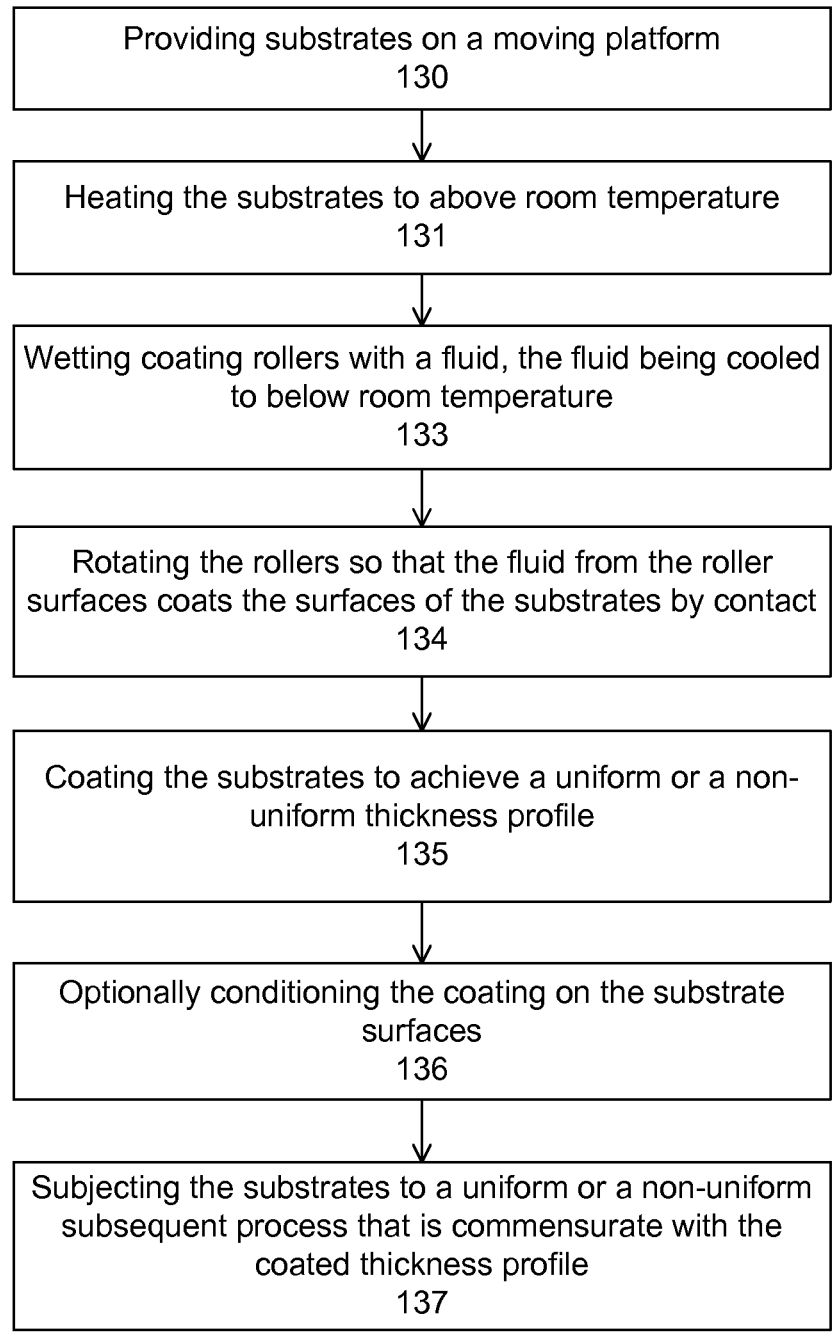
FIG. 15 illustrates an exemplary flowchart of liquid deposition according to an embodiment of the present invention.

FIG. 15 illustrates an exemplary flowchart of liquid deposition according to an embodiment of the present invention. Operation 130 provides one or more substrates on a moving platform, for example, a large flat panel substrate or multiple semiconductor substrates placed in rows. The moving platform can be an in-line conveyor, comprising means such as rollers to move the substrates from one process station to another process station. The moving platform can be an input station for an in-line coating station, accepting substrates and transferring the substrates to the coating zone. The substrate can be prepared before entering the coating station, for example, by a surface cleaning process to remove impurities or particulates, or by an oxidation process to form an oxide layer. In certain cases, the native oxide on the substrate might not be desirable, and thus a HF solution cleaning might be performed to provide a clean surface. The substrate can be transported to an enclosure, for example, by a substrate moving mechanism, or the substrate can move continuously through the enclosure, for example, by an in-line transport mechanism.

In operation 131, the substrates are heated to a desired temperature, such as a temperature to accelerate the reactions of the chemicals deposited thereon, to evaporate the liquid carrier in the chemicals, or to anneal the deposited layers. In operation 132, the substrates enter a coating zone comprising a plurality of coating rollers, some of which also acting as transport rollers to move the substrates forward. Liquid media is transferred to the outer surfaces of the rollers. Optional foam material covering the rollers can be used for improving the coating process, such as reducing substrate damage and improving distribution of liquid media on the substrates. The liquid media is cooled to below room temperature, preferably below a life-preserving temperature for the liquid media. For example, the liquid layer can be an absorber layer in a solar cell device structure, with the absorber chemicals comprising a suspension of small globules of absorber elements in a liquid medium. The absorber chemicals can be stored and delivered at room temperature or sub-room temperature to prevent reaction and prolong the chemical life time. The cooled chemicals are then deposited on hot substrates, using thermal energy to activate a reaction, forming a thin film layer on the substrates.

In operation 133, the rollers are rotating so that the liquid media from the roller surfaces coats the substrate surfaces by contact. In addition, the rotating transport rollers move the substrates to the end of the coating zone. Means for improving the coating layers can be included, such as dry rollers disposed after the liquid rollers for better media distribution.

In operation 135, the substrate is coated with a layer having a uniform or non-uniform thickness profile. For example, the coating layers having non-uniform thickness profile on the substrate surfaces are controlled to compensate for a non-uniformity of a subsequent process, such as a non-uniform temperature profile in the furnace of a subsequent anneal. In optional operation 136, the coating layers are conditioned, for example, drying by thermal energy such as IR lamps or by other forms of energy excitation to the liquid coatings, or by one or more dry rollers. The drying zone can be disposed after the coating zone, for example, by disposing IR heaters after the liquid rollers. Alternatively, the drying zone can be integrated with the coating zone, for example, by disposing IR heaters alternately with the liquid rollers.

In operation 137, the substrate is subjected to a subsequent process that has a uniformity characteristic commensurate with the thickness profile of the coating. For example, the substrates enter a diffusion furnace to drive the dopant to the substrates. The furnace can comprise a plurality of heaters to heat the coating layers to a high temperature, such as between 600 and 1000 C. The furnace can comprise a pre-heating zone, acting to form a transition temperature zone between the hot furnace zone and the room temperature ambient. The pre-heating zone can also act as a drying zone for drying the liquid coating layers. The temperature can be non-uniform in an anneal furnace, and the thickness of the substrates can be used to compensate for this temperature non-uniformity so that a uniform doping profile can be achieved.

In some embodiments, the present invention discloses improvements to the roll-on coating process using coating rollers. For example, the liquid media is kept at low temperature to preserve the reaction characteristics. A temperature barrier or a physical barrier can be used to limit the high temperature exposure of the liquid media.

Figure 16A:
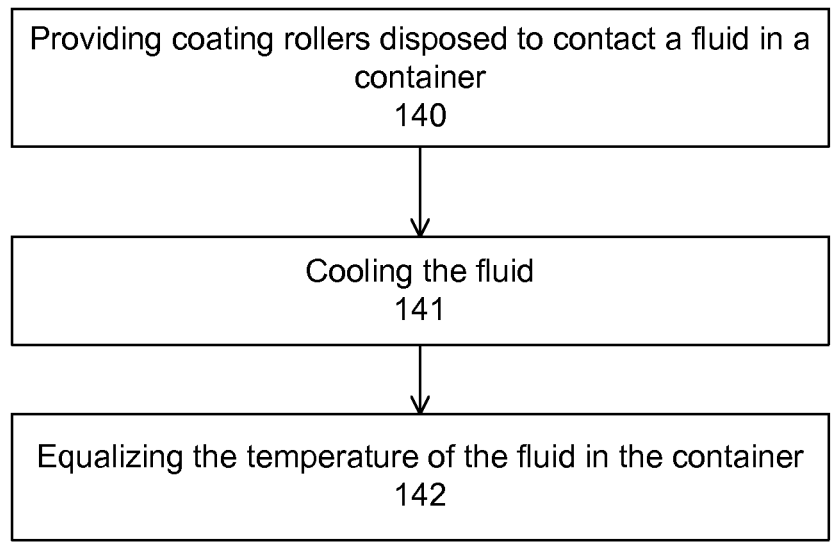
FIGS. 16A-16B illustrate exemplary flowcharts for liquid deposition controls according to an embodiment of the present invention.
Figure 16B:
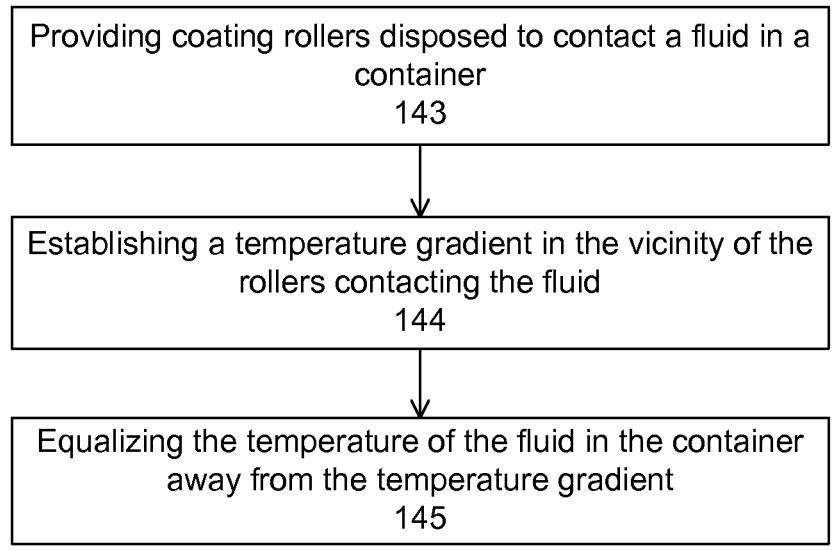

FIGS. 16A-16B illustrate exemplary flowcharts for liquid deposition controls according to an embodiment of the present invention. In FIG. 16A, the liquid media delivered to the substrates is controlled to achieve a desired goal of preventing rapid degradation, together with optimizing the coating and minimizing operation cost. Operation 140 provides one or more coating rollers which are disposed to contact a fluid media in a container. In operation 141, the liquid media is cooled to below room temperature, preferably below 10-15 C, such as at 7 C or so. In operation 142, the temperature of the liquid media in the container is equalized to prevent hot spots, which further assists in prevent high temperature exposure.

In FIG. 16B, a temperature gradient is established in a vicinity of the coating rollers to limit exposing the liquid media to high temperature. Operation 144 provides one or more coating rollers which are disposed to contact a fluid media in a container. Operation 144 establishes a temperature gradient in the vicinity of the rollers contacting the fluid. Operation 145 equalizes the temperature of the fluid in the container away from the temperature gradient.

Figure 17:
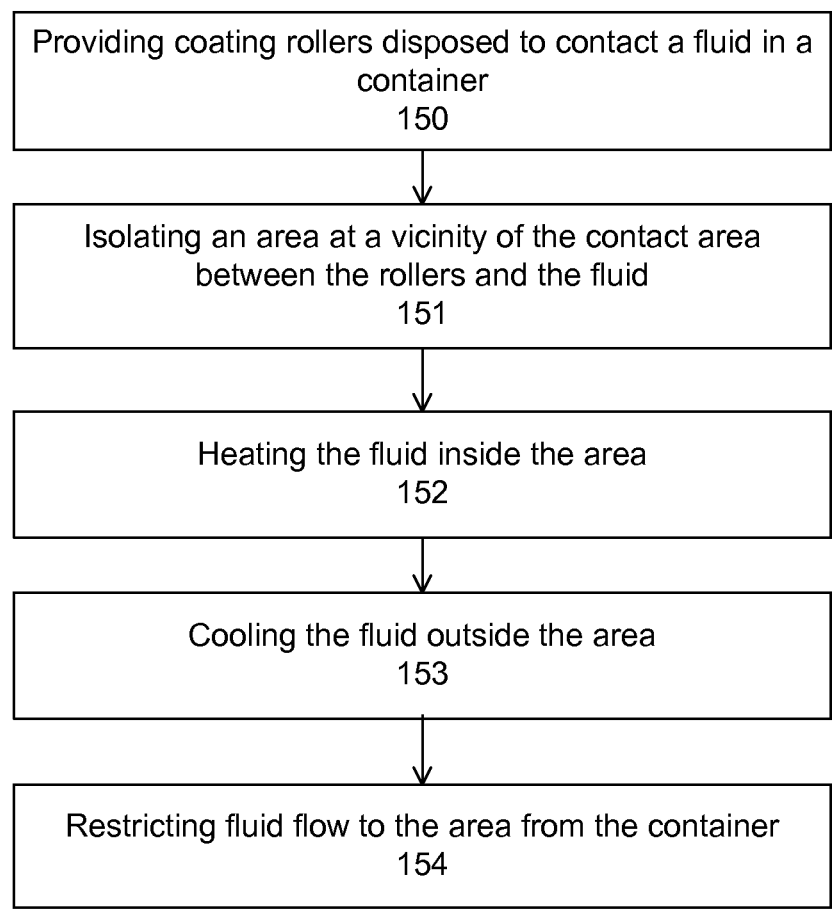
FIG. 17 illustrates an exemplary flowchart for different liquid deposition control processes according to an embodiment of the present invention.

In some embodiments, the present invention discloses different process controls for achieving a desired optimization of the liquid media. FIG. 17 illustrates an exemplary flowchart for different liquid deposition control processes according to an embodiment of the present invention. Physical barrier can be established surrounding the rollers to limit exposing the liquid media to high temperature. Operation 150 provides one or more coating rollers which are disposed to contact a fluid media in a container. Operation 151 isolates an area at a vicinity of the contact area between the rollers and the fluid, effectively creating a physical barrier between two portions of the liquid media in the container. Restrictive communication between the two portions can be provided. Operation 152 heats the fluid media inside the portion, for example, to an intermediate temperature between the process temperature and the low temperature of the liquid media. The intermediate temperature can be room temperature. Operation 153 cools the fluid outside the portion, for example to a life-preserving temperature of the liquid media. Optional temperature equalizer can be added to prevent hot spots. Operation 154 restricts a fluid flow between the two portions. For example, minimum fluid communication is set up between the two portions, to prevent exposing the outside portion to the high temperature of the inner portion.

While the present invention has been described with respect to a preferred mode thereof, it will be apparent that numerous alterations and modifications will be apparent to those skilled in the art without departing from the spirit of the invention. As in all such obvious alterations and modifications, it is desired that they be included within the purview of my invention, which is to be limited only by the scope, including equivalents, of the following appended claims.

What is claimed is:

1. A deposition system for coating a substrate, comprising:
   a heating mechanism to heat the substrate;
   one or more coating rollers, each coating roller comprising a porous layer for accepting and retaining a liquid to transfer to the substrate by rollingly contact;
   a temperature controlling device coupled to the liquid to control the liquid temperature to be below room temperature,
   a liquid reservoir to provide the liquid to the one or more coating rollers,
   wherein the one or more coating rollers contact the liquid in the liquid reservoir for accepting the liquid,
   wherein the temperature controlling device is coupled to the liquid within the liquid reservoir,
   a physical barrier surrounding the one or more coating rollers, the physical barrier comprising restrictive fluid communication between two portions of the liquid in the liquid reservoir isolated by the physical barrier,
   a temperature controlling device coupled to the physical barrier to establish a temperature gradient between the two portions of the liquid in the liquid reservoir.

2. A deposition system as in claim 1 further comprising a stirrer mechanism for equalizing the temperature of the liquid in the liquid reservoir.

3. A deposition system as in claim 1 wherein the heating mechanism is shielded from the liquid reservoir.

4. A deposition system as in claim 1 wherein the temperature of the liquid is less than 10 C.

5. An in-line deposition system for coating a substrate, comprising:
   one or more transport rollers for transport the substrate along the in-line deposition system;
   a substrate heater to heat the substrate;
   a liquid reservoir containing a liquid;
   a cooling device coupled to the liquid reservoir for cooling the liquid to below room temperature,
   one or more coating rollers, each coating gin roller comprising a porous layer contacting the liquid from the liquid reservoir to transfer the liquid to the substrate by rollingly contact,
   wherein the cooling device comprises a device having a heated area and a cooling area with the heated area facing the one or more coating rollers and the cooling area facing the liquid in the liquid reservoir.

6. A deposition system as in claim 5 further comprising a stirrer mechanism for equalizing the temperature of the liquid in the liquid reservoir.

7. A deposition system as in claim 5 further comprising a recirculation system recirculating and filtering the liquid in the liquid reservoir.

8. A deposition system as in claim 5 wherein the cooling device is disposed in a vicinity of the one or more coating rollers to limit the exposure of liquid in the liquid reservoir to high temperature.

9. A deposition system as in claim 5 wherein the heating mechanism is shielded from the liquid reservoir.

10. A deposition system as in claim 5 wherein the liquid comprises a chemical having degradation characteristic when exposed to temperature above room temperature.

11. A deposition system for coating a substrate, comprising:
- a heating mechanism to heat the substrate;
- one or more coating rollers, each coating roller comprising a porous layer for accepting and retaining a liquid to transfer to the substrate by rollingly contact;
- a temperature controlling device coupled to the liquid to control the liquid temperature to be below room temperature,
- a liquid reservoir to provide the liquid to the one or more coating rollers,
- wherein the one or more coating rollers contact the liquid in the liquid reservoir for accepting the liquid,
- wherein the temperature controlling device is coupled to the liquid within the liquid reservoir,
- a physical barrier surrounding the one or more coating rollers, the physical barrier comprising restrictive fluid communication between two portions of the liquid in the liquid reservoir isolated by the physical barrier,
- a temperature barrier surrounding the one or more coating rollers, the temperature barrier creating a temperature gradient between two portions of the liquid in the liquid reservoir isolated by the temperature barrier.

12. A deposition system as in claim 11 further comprising a stirrer mechanism for equalizing the temperature of the liquid in the liquid reservoir.

13. A deposition system as in claim 11 wherein the heating mechanism is shielded from the liquid reservoir.

14. A deposition system as in claim 11 wherein the temperature of the liquid is less than 10 C.

15. An in-line deposition system for coating a substrate, comprising:
- one or more transport rollers for transport the substrate along the in-line deposition system;
- a substrate heater to heat the substrate;
- a liquid reservoir containing a liquid;
- a cooling device coupled to the liquid reservoir for cooling the liquid to below room temperature;
- one or more coating rollers, each coating roller comprising a porous layer contacting the liquid from the liquid reservoir to transfer the liquid to the substrate by rollingly contact;
- a physical barrier surrounding the one or more coating rollers, the physical barrier comprising restrictive fluid communication between two portions of the liquid in the liquid reservoir isolated by the physical barrier; and
- a temperature controlling device coupled to the physical barrier to establish a temperature gradient between the two portions.

16. A deposition system as in claim 15 wherein the cooling device is disposed in a vicinity of the one or more coating rollers to limit the exposure of liquid in the liquid reservoir to high temperature.

17. A deposition system as in claim 15 wherein the liquid comprises a chemical having degradation characteristic when exposed to temperature above room temperature.

18. An in-line deposition system for coating a substrate, comprising:
- one or more transport rollers for transport the substrate along the in-line deposition system;
- a substrate heater to heat the substrate;
- a liquid reservoir containing a liquid;
- a cooling device coupled to the liquid reservoir for cooling the liquid to below room temperature;
- one or more coating rollers, each coating roller comprising a porous layer contacting the liquid from the liquid reservoir to transfer the liquid to the substrate by rollingly contact;
- a physical barrier surrounding the one or more coating rollers, the physical barrier comprising restrictive fluid communication between two portions of the liquid in the liquid reservoir isolated by the physical barrier; and
- a temperature barrier surrounding the one or more coating rollers, the temperature barrier creating a temperature gradient between two portions of the liquid in the liquid reservoir isolated by the temperature barrier.

19. A deposition system as in claim 18 further comprising a stirrer mechanism for equalizing the temperature of the liquid in the liquid reservoir.

20. A deposition system as in claim 18 further comprising a recirculation system recirculating and filtering the liquid in the liquid reservoir.

* * * * *